(12) United States Patent
Bullock et al.

(10) Patent No.: US 11,244,819 B2
(45) Date of Patent: Feb. 8, 2022

(54) LOAD LOCK CHAMBER ASSEMBLIES FOR SAMPLE ANALYSIS SYSTEMS AND RELATED MASS SPECTROMETER SYSTEMS AND METHODS

(71) Applicant: bioMerieux, Inc., Durham, NC (US)

(72) Inventors: Jared Bullock, Saint Louis, MO (US); Scott Collins, Westford, MA (US); Mark Talmer, Pepperell, MA (US)

(73) Assignee: bioMérieux, Inc., Durham, NC (US)

( * ) Notice: Subject to any disclaimer, the term of this patent is extended or adjusted under 35 U.S.C. 154(b) by 0 days.

(21) Appl. No.: 16/950,992

(22) Filed: Nov. 18, 2020

(65) Prior Publication Data

US 2021/0074535 A1 Mar. 11, 2021

Related U.S. Application Data

(62) Division of application No. 16/271,999, filed on Feb. 11, 2019, now Pat. No. 10,872,754.
(Continued)

(51) Int. Cl.
*H01J 49/04* (2006.01)
*H01J 49/00* (2006.01)
(Continued)

(52) U.S. Cl.
CPC ...... *H01J 49/0495* (2013.01); *H01J 49/0031* (2013.01); *H01J 49/0409* (2013.01); *G01N 2035/00039* (2013.01); *H01J 37/18* (2013.01)

(58) Field of Classification Search
CPC .... H01J 37/18; H01J 49/0031; H01J 49/0409; H01J 49/0495; H01J 49/0027; G01N 2035/0039
See application file for complete search history.

(56) References Cited

U.S. PATENT DOCUMENTS

| 4,699,555 A | * | 10/1987 | Guarino | H01J 37/20 414/217 |
| 5,498,545 A | | 3/1996 | Vestal | |

(Continued)

OTHER PUBLICATIONS

"Biomerieux "Vitek MS expanded database" Product brochure, https://www.biomerieux-diagnostics.com/vitekr-ms-0 (3 pages) (date unknown, but prior to filing date of the present application)".
(Continued)

*Primary Examiner* — David E Smith
(74) *Attorney, Agent, or Firm* — Myers Bigel, P.A.

(57) ABSTRACT

Load lock assemblies for a sample analysis system, such as a mass spectrometry system, include a load lock chamber having longitudinally opposing first and second end portions and a through channel, a door coupled to the second end portion, and a seal assembly coupled to the first end portion. The seal assembly includes a rigid seal housing member coupled to a housing of the load lock chamber. The rigid seal housing member includes a port forming part of the first end portion of the through channel of the load lock chamber. The rigid seal housing member can include a self-centering cartridge and/or a flexure member coupled to the housing of the load lock chamber. Where used, the flexure member has an outer perimeter that extends above and below the rigid seal housing member and includes an aperture that is aligned with the port of the rigid seal housing member.

13 Claims, 24 Drawing Sheets
(1 of 24 Drawing Sheet(s) Filed in Color)

Related U.S. Application Data

(60) Provisional application No. 62/629,746, filed on Feb. 13, 2018.

(51) Int. Cl.
  *H01J 37/18* (2006.01)
  *G01N 35/00* (2006.01)

(56) References Cited

U.S. PATENT DOCUMENTS

| | | | |
|---|---|---|---|
| 5,625,184 A | 4/1997 | Vestal et al. | |
| 5,627,369 A | 5/1997 | Vestal et al. | |
| 5,760,393 A | 6/1998 | Vestal et al. | |
| 5,969,348 A | 10/1999 | Franzen | |
| 6,002,127 A | 12/1999 | Vestal et al. | |
| 6,057,543 A | 5/2000 | Vestal et al. | |
| 6,090,176 A | 7/2000 | Yoshitake et al. | |
| 6,281,493 B1 | 8/2001 | Vestal et al. | |
| 6,541,765 B1 | 4/2003 | Vestal | |
| RE39,353 E | 10/2006 | Vestal | |
| 7,405,396 B2 | 7/2008 | Cygan et al. | |
| 7,564,028 B2 | 7/2009 | Vestal | |
| 8,752,873 B2 | 6/2014 | Hajrovic | |
| 9,214,323 B1 | 12/2015 | Vestal et al. | |
| 9,362,095 B1* | 6/2016 | Hayden | H01J 49/0409 |
| 9,536,726 B2* | 1/2017 | VanGordon | H01J 49/0418 |
| 10,665,444 B2* | 5/2020 | Bullock | G01N 35/00029 |
| 2002/0024642 A1 | 2/2002 | Zemel | |
| 2006/0050376 A1 | 3/2006 | Houston et al. | |
| 2006/0216207 A1 | 9/2006 | Lehto | |
| 2008/0216590 A1 | 9/2008 | Blanton et al. | |
| 2015/0137000 A1 | 5/2015 | Naruse | |
| 2015/0198681 A1 | 7/2015 | Chintalapati | |
| 2017/0316928 A1 | 11/2017 | Hunter et al. | |
| 2017/0341873 A1 | 11/2017 | Vivet et al. | |
| 2018/0119137 A1 | 5/2018 | Matsuguchi et al. | |
| 2019/0033256 A1* | 1/2019 | Matsushita | H01J 49/04 |
| 2019/0066990 A1* | 2/2019 | Matsushita | H01J 49/0409 |

OTHER PUBLICATIONS

International Search Report and the Written Opinion of the International Searching Authority corresponding to International Patent Application No. PCT/US2019/017507 (12 pages) (dated Apr. 12, 2019).

Vestal, Marvin L. "Modern MALDI time-of-flight mass spectrometry" Journal of Mass Spectrometry, 44:303-317 (2009).

Vestal et al., "High Performance MALDI-TOF mass spectrometry for proteomics" International Journal of Mass Spectrometry, 268(12):83-92 (2007).

Vestal et al., "Resolution and Mass Accuracy in Matrix-Assisted Laser Desorption Ionization-Time-of-Flight" Journal of the American Society for Mass Spectrometry, 9:892-911 (1998).

Wiley et al., "Time-of-Flight Mass Spectrometer with Improved Resolution" The Review of Scientific Instruments, 26 (12):1150-1157 (1955).

* cited by examiner

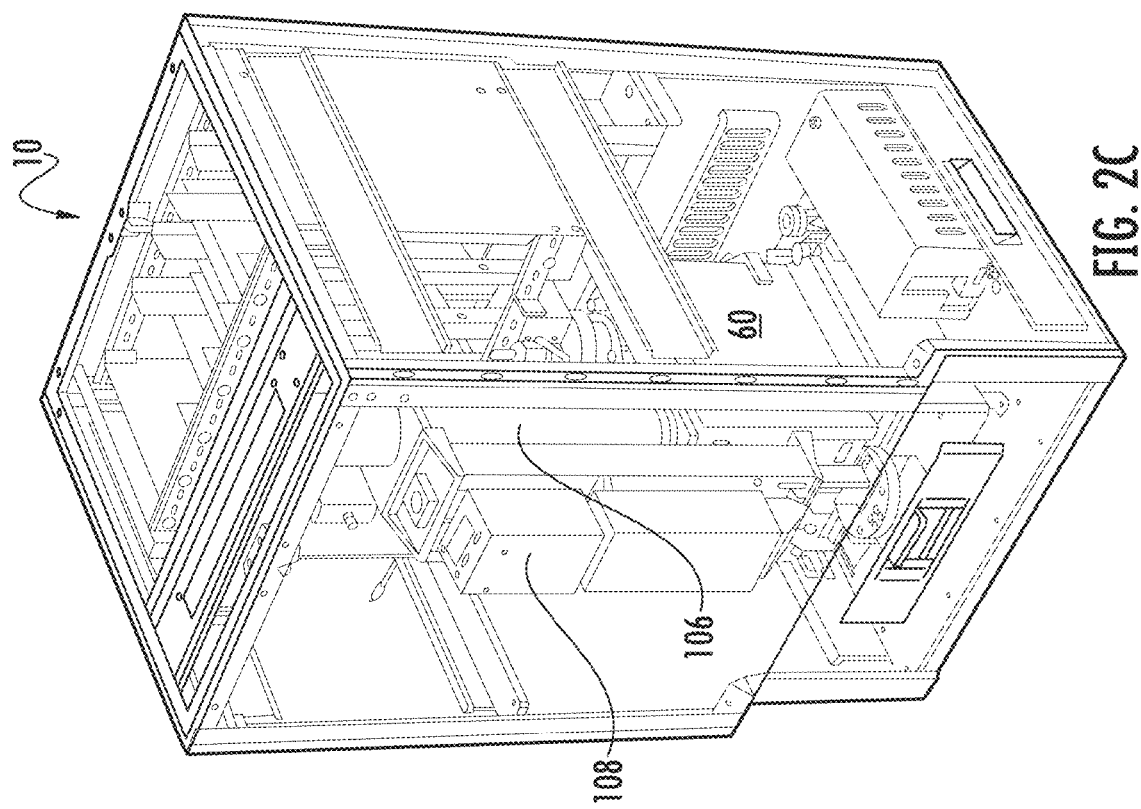
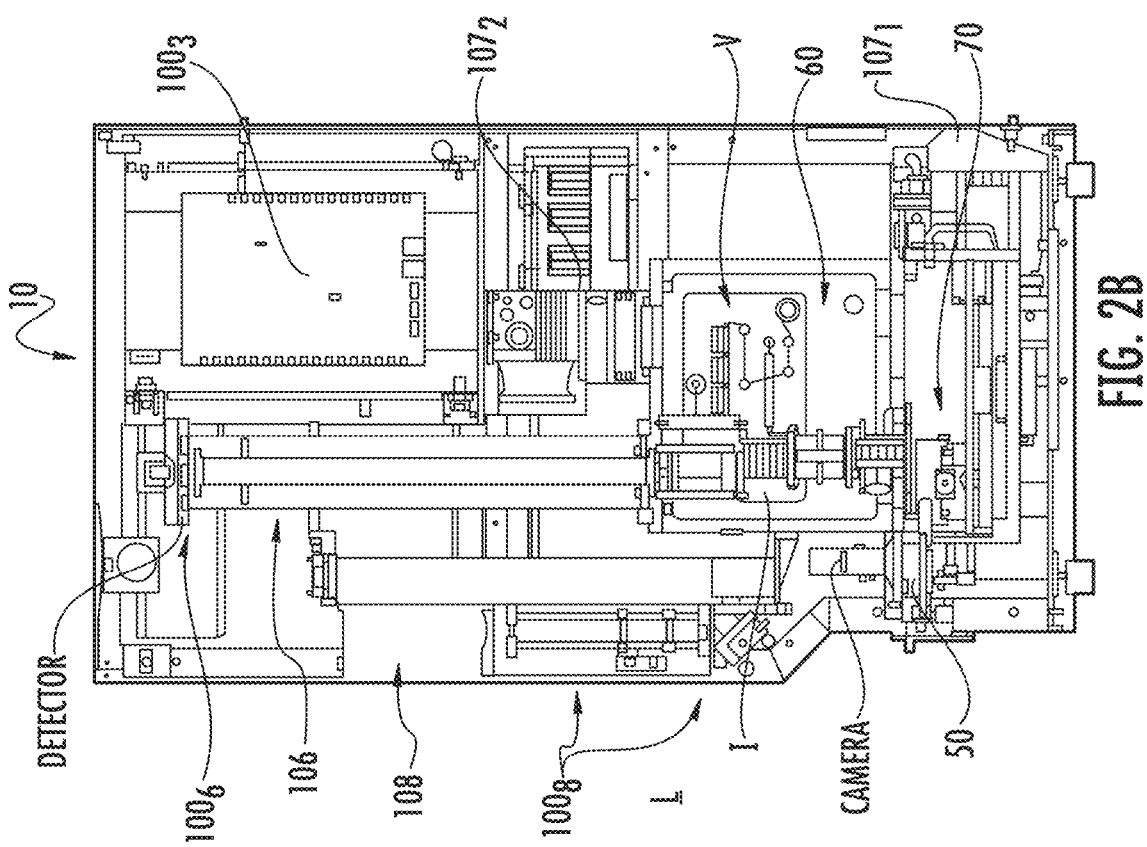

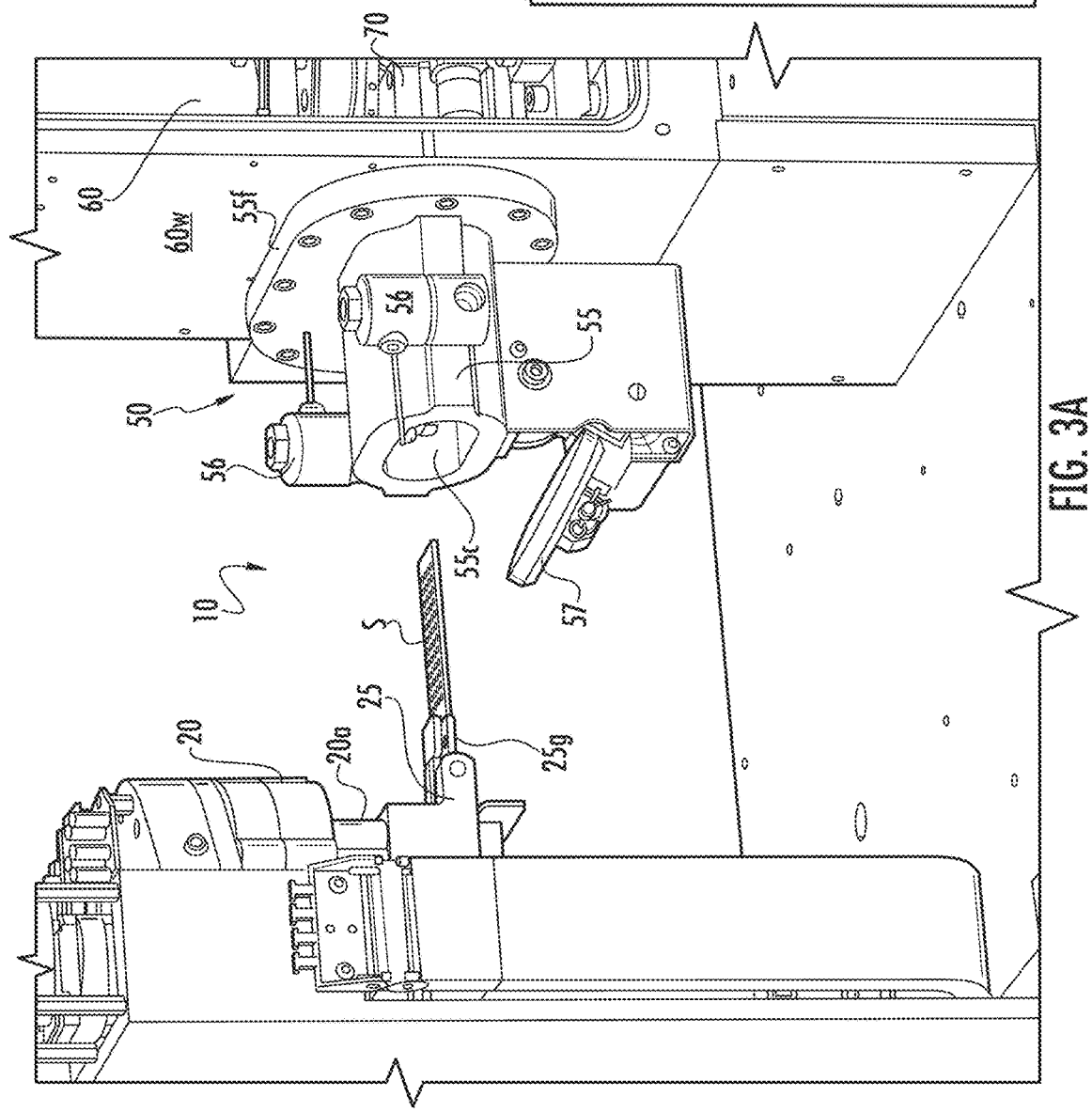
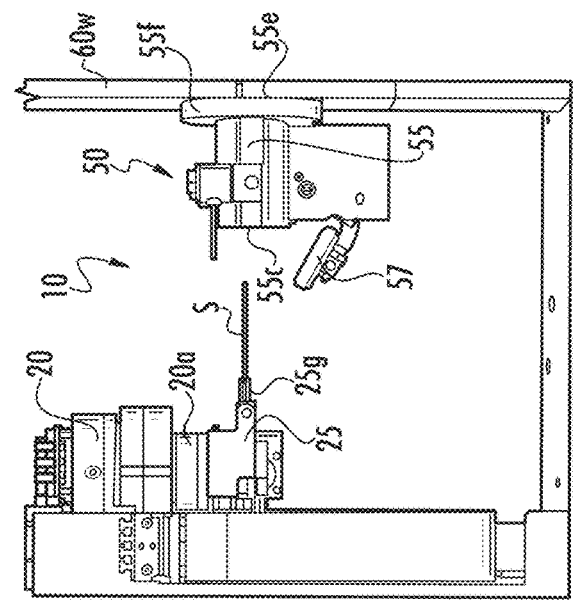
FIG. 3A
FIG. 3B

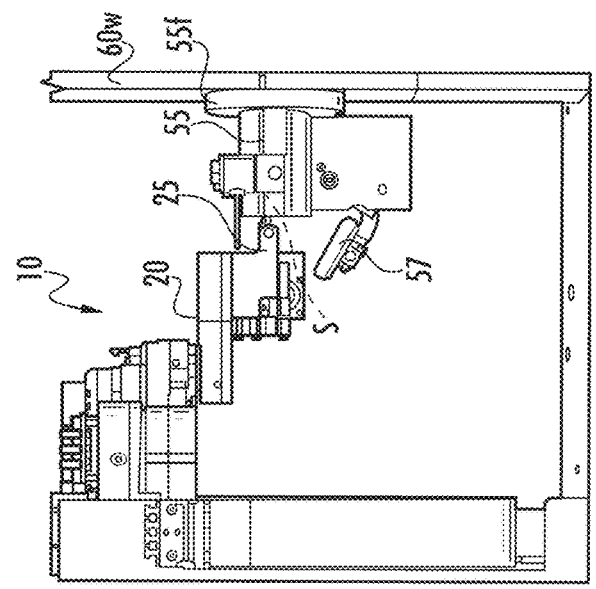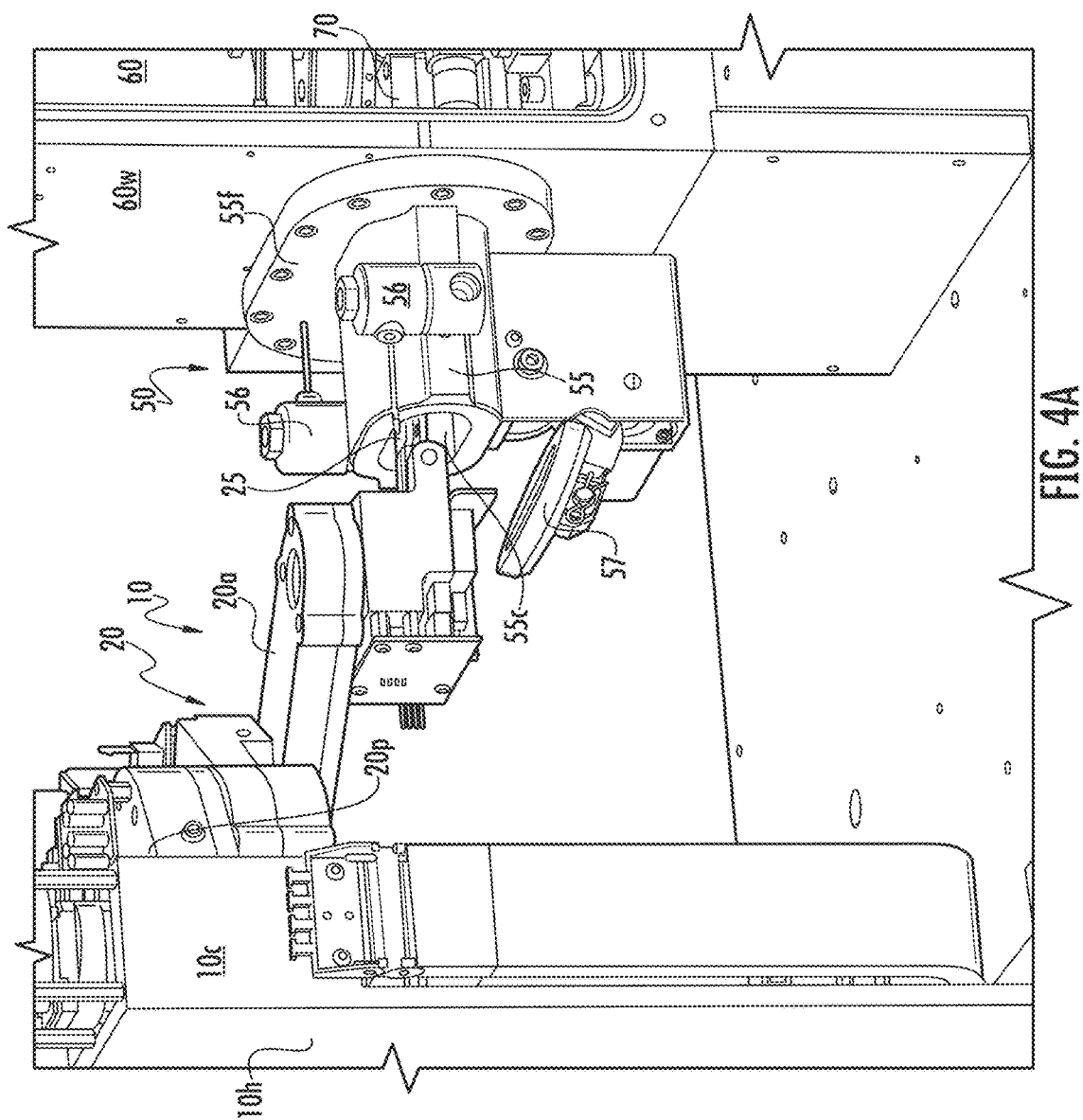

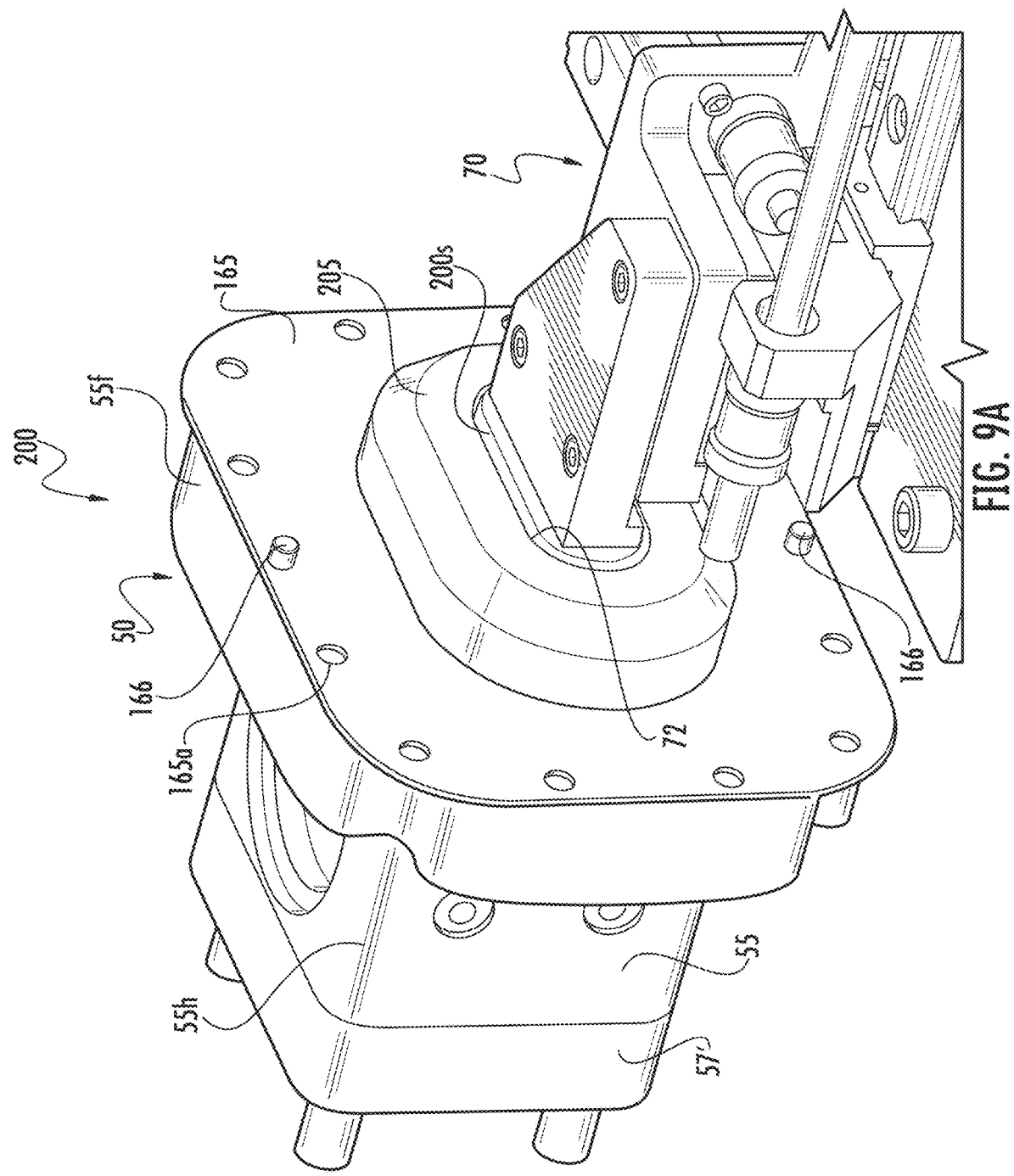

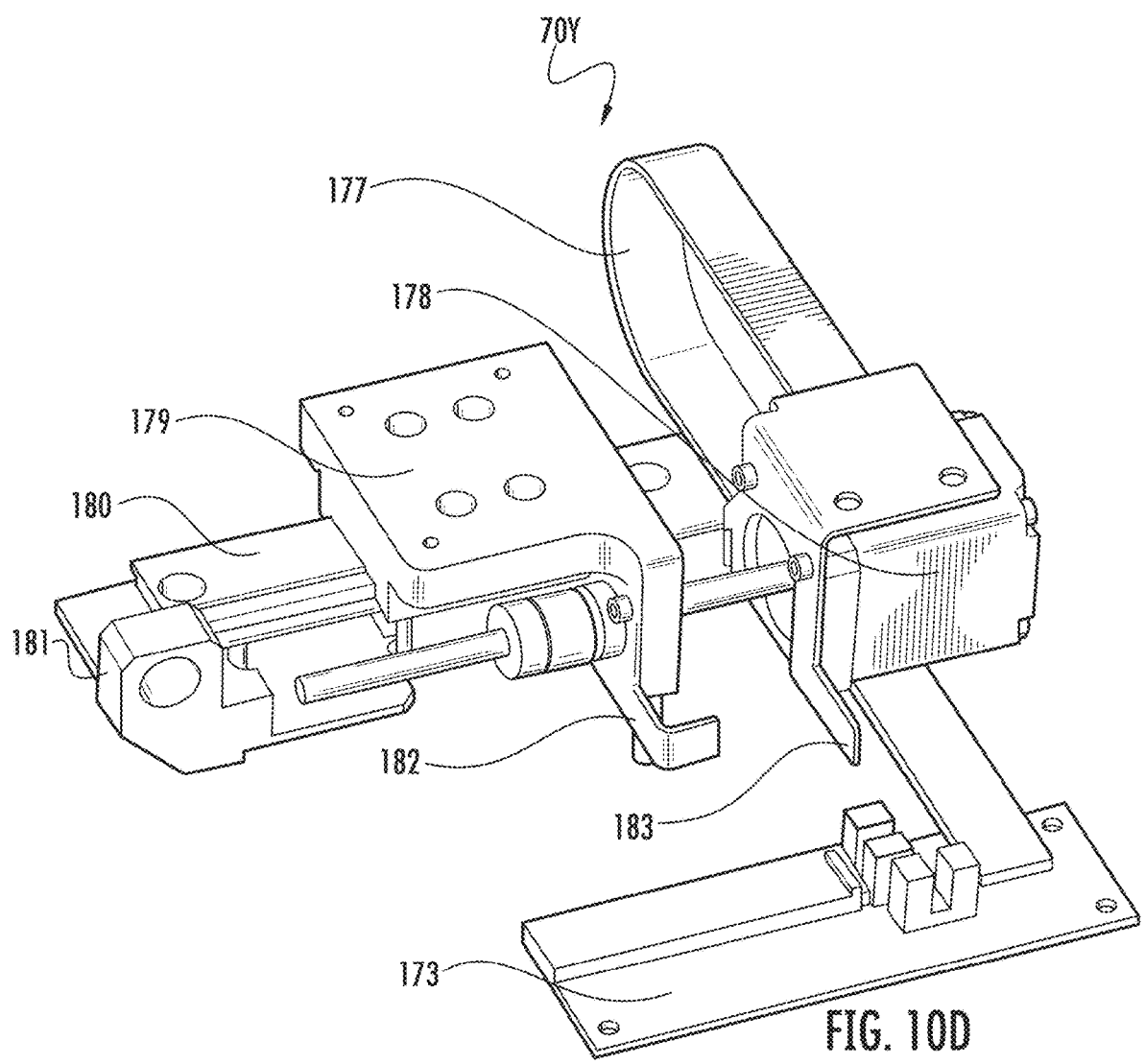

LOAD LOCK CHAMBER ASSEMBLIES FOR SAMPLE ANALYSIS SYSTEMS AND RELATED MASS SPECTROMETER SYSTEMS AND METHODS

RELATED APPLICATIONS

This application is a divisional application of U.S. patent application Ser. No. 16/271,999 filed Feb. 11, 2019, which claims the benefit of and priority to U.S. Provisional Application Ser. No. 62/629,746, filed Feb. 13, 2018, the contents of which are hereby incorporated by reference as if recited in full herein.

FIELD OF THE INVENTION

The present invention relates to analysis instruments and may be particularly suitable for mass spectrometers.

BACKGROUND OF THE INVENTION

Mass spectrometers are devices which ionize a sample and then determine the mass to charge ratios of the collection of ions formed. One well known mass analyzer is the time-of-flight mass spectrometer (TOFMS), in which the mass to charge ratio of an ion is determined by the amount of time required for that ion to be transmitted under the influence of electric fields (pulsed and/or static) from the ion source to a detector. The spectral quality in TOFMS reflects the initial conditions of the ion beam prior to acceleration into a field free drift region. Specifically, any factor which results in ions of the same mass having different kinetic energies and/or being accelerated from different points in space will result in a degradation of spectral resolution, and thereby, a loss of mass accuracy. Matrix assisted laser desorption ionization (MALDI) is a well-known method to produce gas phase biomolecular ions for mass spectrometric analysis. The development of delayed extraction (DE) for MALDI-TOF has made high resolution routine for MALDI-based instruments. In DE-MALDI, a short delay is added between the ionization event, triggered by the laser, and the application of the accelerating pulse to the TOF source region. The fast (i.e., high-energy) ions will travel farther than the slow ions thereby transforming the energy distribution upon ionization to a spatial distribution upon acceleration (in the ionization region prior to the extraction pulse application).

See U.S. Pat. Nos. 5,625,184, 5,627,369 and 5,760,393. See also, Wiley et al., *Time-of-flight mass spectrometer with improved resolution*, Review of Scientific Instruments vol. 26, no. 12, pp. 1150-1157 (online 2004, 1995); M. L. Vestal, *Modern MALDI time-of-flight mass spectrometry*, Journal of Mass Spectrometry, vol. 44, no. 3, pp. 303-317 (2009); Vestal et al., *Resolution and mass accuracy in matrix-assisted laser desorption ionization-time-of-flight*, Journal of the American Society for Mass Spectrometry, vol. 9, no. 9, pp. 892-911 (1998); and Vestal et al., *High Performance MALDI-TOF mass spectrometry for proteomics*, International Journal of Mass Spectrometry, vol. 268, no. 2, pp. 83-92 (2007). The contents of these documents are hereby incorporated by reference as if recited in full herein.

SUMMARY OF EMBODIMENTS OF THE INVENTION

Embodiments of the present invention are directed to mass spectrometry systems with a load lock chamber connected to a vacuum chamber for sample analysis.

The load lock chamber can include a thin flexure member that can cooperate with a seal interface for sealing the load lock chamber from the vacuum chamber.

Embodiments of the invention are directed to delayed extraction (DE) matrix assisted laser desorption ionization (MALDI) time-of-flight mass spectrometers (TOF MS). The flight tube can have a length that is between about 0.4 m and about 1 m. However, longer or shorter lengths may optionally be used.

Embodiments of the invention are directed to load lock assemblies for a sample analysis system. The assemblies include a housing with a load lock chamber. The load lock chamber has longitudinally opposing first and second end portions and a through channel, a door coupled to the second end portion and a seal assembly cartridge coupled to the first end portion. The seal assembly cartridge includes a seal housing member attached to the housing of the load lock chamber. The seal housing member includes a port forming part of the through channel at the first end portion of the load lock chamber. The seal assembly cartridge has a first nominal position whereby the seal assembly cartridge can float side to side and/or up and down relative to the housing and the seal assembly cartridge has a second operative position that can be offset from the first nominal position to thereby allow a self-centering alignment with an X-Y stage vacuum seal interface.

The seal housing member can have a plurality of spaced apart apertures that align with through apertures in a wall inside the load lock chamber. Fixation members can extend longitudinally through the wall into the apertures of the seal housing member to attach the seal assembly cartridge to the housing of the load lock chamber. When the fixation members are in a loosened state, the seal assembly cartridge can be in the first nominal position and when the fixation members are tightened, the seal assembly cartridge can be in the second operative position.

The load lock assembly can include a retainer member coupled to the seal housing member with an O-ring therebetween. The O-ring can project a distance outside the seal housing member.

The through channel can be oblong in a lateral dimension with laterally opposing arcuate ends.

The seal housing member can have a groove about an entire perimeter of the port and both the groove and port can be oblong in a lateral dimension with opposing laterally spaced apart arcuate ends.

The housing of the load lock chamber can have a flange surrounding a recess at the first end portion of the load lock chamber. The seal housing member can reside in the recess.

The channel of the load lock chamber can have a lateral width that is greater than a height and a volume that can be between 1 cc and 100 cc.

The load lock assembly can further include at least one valve in communication with the load lock chamber to be able to vent to atmosphere and/or apply a vacuum to the load lock chamber.

The door can be pivotably attached to the second end portion of the load lock chamber to be able to sealably close the door against the second end portion of the load lock chamber.

The load lock assembly can further include a motor with a shaft coupled to a first gear that engages a second gear that is attached to the door to automatically open and close the door.

The second gear can be coupled to an arm attached to the door. The second gear can have a body with only three sides with one of the three sides having an outer perimeter with gear teeth and an angular extent of between 60-120 degrees.

The load lock assembly can be in combination with an X-Y stage with a slide holder having a seal interface surface. Insertion of the slide holder into the seal assembly cartridge to engage a seal interface of the slide holder while the seal assembly cartridge is in the first nominal position can force the seal cartridge assembly to the second operative position before the fixation members are tightened.

The seal interface surface of the slide holder can be oblong in a lateral dimension and can have a perimeter with laterally spaced apart opposing arcuate ends and an outer surface that tapers down in a direction toward a recess of the slide holder.

There can be between eight and twelve of the spaced apart apertures of the seal housing member. The seal housing member can further include a plurality of spaced apart apertures aligned with apertures in a retention member with fixation members extending therethrough. The fixation members that extend through the retention plate can have external facing heads and can be shorter than the fixation members attached to the wall of the load lock chamber.

The load lock assembly can further include: first and second laterally oblong O-rings held on opposing and longitudinally spaced apart first and second ends of the seal housing member, with the first O-ring held on the first end facing a door of the load lock chamber being larger than the second O-ring held on the second end and a retention member coupled to the second O-ring and the second end of the seal housing member. The retention member can include apertures that align with apertures in the second end of the seal housing member. A plurality of load lock chamber fixation members can extend through apertures in the first end of the seal housing member. The assembly can also include a plurality of retention member fixation members extending through the apertures of the retention member into the second end of the seal housing member. The retention member fixation members can be shorter than the load lock chamber fixation members.

Other embodiments are directed to mass spectrometry systems. The systems include: a vacuum chamber with a first wall having an aperture; an X-Y stage in the vacuum chamber; and a load lock chamber assembly comprising a housing with a load lock chamber. The load lock chamber includes a longitudinally extending through channel having opposing first and second end portions. The load lock chamber is attached to the first wall of the vacuum chamber with the first end portion inside or adjacent the first wall of the vacuum chamber. The load lock chamber assembly further includes a door sealably and releasably coupled to the second end portion of the load lock chamber and a seal assembly cartridge comprising a port forming part of the first end portion of the load lock chamber. The seal assembly cartridge has a first nominal position whereby the seal assembly cartridge can float side to side and up and down relative to the housing of the load lock chamber assembly. The seal assembly cartridge has a second operative position that can be offset from the nominal first position in response to engagement of a vacuum seal interface of the X-Y stage to thereby provide a self-centering alignment with the X-Y stage seal interface.

The seal assembly cartridge can include a seal housing member coupled to the housing of the load lock chamber. The seal housing member can have a surface facing the vacuum chamber with a channel that extends about the port. An O-ring can reside in the channel of the seal housing member and can be held so that the O-ring projects a distance outside the channel of the seal housing member. The cartridge can also include a retention member that is coupled to the seal housing member with the O-ring therebetween. The X-Y stage can have a slide holder with a seal interface that slidably engages the O-ring to seal the first end portion of the load lock chamber.

There can be between eight and twelve spaced apart apertures positioned about a perimeter of the seal housing member. Fixation members can extend therethough and can be attached to an inner wall segment of the load lock chamber in a loosened state to allow the float. The fixation members can be tightened to secure the seal assembly cartridge to the housing of the load lock chamber in the second operative position.

The housing of the load lock chamber can have a flange that surrounds a recess with a wall segment accessible via the through channel and comprising spaced apart through apertures. The flange can be attached to the first wall of the vacuum chamber. A seal housing member of the seal assembly cartridge can reside in the recess with fixation members extending through the through apertures of the wall segment into apertures of the seal housing member. The X-Y stage seal interface can be oblong and has a perimeter with laterally spaced apart opposing arcuate ends and an outer surface that angles down in a direction toward a recess of the slide holder. The through channel of the load lock chamber can be oblong in a lateral dimension with laterally opposing arcuate ends.

The seal assembly cartridge can have a seal housing member with a plurality of spaced apart apertures that align with through apertures in a wall inside the load lock chamber. Fixation members can extend longitudinally through the wall into the apertures of the seal housing member to attach the seal assembly cartridge to the housing of the load lock chamber. When the fixation members are in a loosened state, the seal assembly cartridge can be in the first nominal position and, when the fixation members are tightened, the seal assembly cartridge can be in the second operative position.

Yet other embodiments of the invention are directed to methods of handling a sample for analysis. The methods include: providing a mass spectrometer with a load lock chamber with opposing first and second end portions, the first end portion being in or adjacent an acquisition vacuum chamber and a second end portion that is spaced apart from the first end portion and has a door; inserting a slide holder of an X-Y stage into the load lock chamber from the acquisition vacuum chamber while the door is sealably closed to the second end portion of the load lock chamber; automatically sealing the first end portion of the load lock chamber from the acquisition vacuum chamber upon engagement of a seal interface of the slide holder with a seal interface of the first end portion of the load lock chamber; venting the load lock chamber to atmosphere; opening the door; inserting a slide from the second end portion of the load lock chamber to engage the slide holder in the load lock chamber; closing the door to seal the load lock chamber; evacuating the load lock chamber to a vacuum pressure; and retracting the slide holder with the slide into the vacuum chamber while the door is closed and the load lock chamber is under vacuum.

The methods can further include analyzing a sample in or on the slide. The sample can be analyzed to identify one or more microorganisms by analyzing a mass range between about 2000 to about 20,000 Dalton.

The methods can include during set-up or installation: inserting the slide holder of an X-Y stage into the load lock chamber from the acquisition vacuum chamber; moving a seal assembly cartridge from a nominal position side to side and/or up or down to a self-centered second position to align with the seal interface of the slide holder in response to the inserting; and then securing the seal assembly cartridge to a fixed position on the housing of the load lock chamber to provide an operative aligned position with the X-Y stage.

The methods can include flexing a flexure member on the first end portion of the load lock chamber in response to the venting and/or the evacuating. The flexure member can have an outer perimeter that extends above and below a rigid seal housing member on the first end portion of the load lock chamber. The flexure member comprises an aperture that is aligned with the chamber.

Yet other embodiments are directed to a load lock assembly for a sample analysis system. The assembly includes: a load lock chamber having longitudinally opposing first and second end portions and a through channel; a door coupled to the second end portion; and a seal assembly coupled to the first end portion. The seal assembly includes a rigid seal housing member coupled to a housing of the load lock chamber. The rigid seal housing member can have a port forming part of the through channel at the first end portion of the load lock chamber. The seal assembly can also include a flexure member coupled to the housing of the load lock chamber and to the rigid seal housing member. The flexure member has an outer perimeter that extends above and below the rigid seal housing member and has an aperture that is aligned with the port of the rigid seal housing member.

The flexure member can be a thin sheet of material. The outer perimeter of the flexure member can have a plurality of spaced apart apertures that align with apertures in a flange of the housing of the load lock chamber.

The rigid seal housing member can have an outer facing surface with a channel that extends about the port. The rigid seal housing member can hold an O-ring in the channel so that the O-ring projects a distance outside the channel.

The port can be oblong in a lateral dimension with laterally opposing arcuate ends.

The channel of the outer facing surface and the O-ring can extend about an entire perimeter of the port and both can be oblong in a lateral dimension with opposing laterally spaced apart arcuate ends.

The housing of the load lock chamber can have a flange surrounding a recess at the first end portion of the load lock chamber. The flexure member can be attached to the flange. The rigid seal housing member can reside in the recess.

The through channel of the load lock chamber can have a lateral width that is greater than a height and a volume that can be between 1 cc and 100 cc.

The assembly can have at least one valve in communication with the load lock chamber to be able to vent to atmosphere and/or apply a vacuum to the load lock chamber.

The door of the load lock assembly can be pivotably attached to the second end portion of the load lock chamber to be able to sealably close the door against the second end portion of the load lock chamber.

The load lock assembly can include a motor with a shaft coupled to a first gear that engages a second gear that is attached to the door to automatically open and close the door.

The second gear can be coupled to an arm attached to the door and wherein the second gear can have only three sides, with one of the three sides having an outer perimeter with gear teeth and an angular extent of between 60-120 degrees.

The load lock assembly can be in combination with an X-Y stage with a slide holder comprising a seal surface that slidably engages the O-ring to seal the first end portion of the load lock chamber.

The seal surface can be oblong in a lateral dimension and can have a perimeter with laterally spaced apart opposing arcuate ends and an outer surface that tapers down in a direction toward a recess of the slide holder.

The rigid seal housing member can be a first rigid seal housing member and the load lock assembly can further include a second rigid seal housing member coupled to the first rigid seal housing member. The second rigid seal housing member can have a port that aligns with the port of the first rigid seal housing member. The flexure member can be sandwiched between the first and second rigid seal housing members.

Yet other embodiments are directed to a mass spectrometry system that includes: a vacuum chamber with a first wall having an aperture; an X-Y stage in the vacuum chamber; and a load lock chamber assembly with a load lock chamber having a longitudinally extending through channel having opposing first and second end portions. The load lock chamber is attached to the first wall of the vacuum chamber with the first end portion inside or adjacent the first wall of the vacuum chamber. The load lock chamber assembly can further include: a door coupled to the second end portion of the load lock chamber; a rigid seal housing member comprising a port forming part of the first end portion of the load lock chamber; and a flexure member coupled to a housing of the load lock chamber and to the rigid seal housing member, wherein the flexure member comprises an outer perimeter that extends above and below the rigid seal housing member. The flexure member includes an aperture that is aligned with the port of the rigid seal housing member.

The rigid seal housing member can have an outer facing surface with a channel that extends about the port. The rigid seal housing member can hold an O-ring in the channel so that the O-ring projects a distance outside the channel. The X-Y stage can have a slide holder with a seal interface that slidably engages the O-ring to seal the first end portion of the load lock chamber.

The seal interface can be oblong and can have a perimeter with laterally spaced apart opposing arcuate ends and an outer surface that angles down in a direction toward a recess of the slide holder.

The flexure member can be a thin stainless steel sheet. The outer perimeter can have a plurality of spaced apart apertures that align with apertures in a flange of the housing of the load lock chamber. Pins or other attachment members extend through the aligned apertures and attach to the first wall of the vacuum chamber.

The through channel can be oblong in a lateral dimension with laterally opposing arcuate ends.

Yet other embodiments are directed to methods of aligning an X-Y stage with a load lock chamber of a sample analysis instrument during set-up or installation. The methods include: inserting a slide holder of the X-Y stage into the load lock chamber from an acquisition vacuum chamber; moving a seal assembly cartridge from a nominal position side to side and/or up or down to a self-centered second position to align with the seal interface of the slide holder in response to the inserting; and then securing the seal assembly cartridge to a fixed position on the housing of the load lock chamber to provide an operative aligned position with the X-Y stage.

The method can include analyzing a sample in or on the slide. The sample can be analyzed to identify one or more microorganisms by analyzing a mass range between about 2000 to about 20,000 Dalton.

The sample can be undergoing analysis to identify if one or more different types of bacteria and/or fungi may be present by analyzing a mass range between about 2000-20,000 Dalton.

The method can include identifying a microorganism or protein in the sample based on the signal.

Further features, advantages and details of the present invention will be appreciated by those of ordinary skill in the art from a reading of the figures and the detailed description of the preferred embodiments that follow, such description being merely illustrative of the present invention.

It is noted that aspects of the invention described with respect to one embodiment, may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail in the specification set forth below.

BRIEF DESCRIPTION OF THE DRAWINGS

The patent or application file contains at least one drawing executed in color. Copies of this patent or patent application publication with color drawings will be provided by the Office upon request and payment of the necessary fee.

FIGS. 2B and 2C are partial transparent side perspective views of a sample analysis instrument comprising some or all of the modules shown in FIG. 2A according to embodiments of the present invention.

FIG. 3A is a side perspective view of a slide handling system and load lock chamber, shown in a ready to load configuration, according to embodiments of the present invention.

FIG. 3B is a side view of the components shown in FIG. 3A.

FIG. 4A is a side perspective view of the slide handling system and load lock chamber shown in FIG. 3A, shown in a loading configuration according to embodiments of the present invention.

FIG. 4B is a side view of the components and configuration shown in FIG. 4A.

FIG. 9A is a side perspective view of the load lock chamber with the load lock assembly with the seal assembly cartridge coupled to an X-Y stage according to embodiments of the present invention.

FIG. 10D is a top perspective view of the Y-axis components of the X-Y stage according to embodiments of the present invention.

DETAILED DESCRIPTION OF EMBODIMENTS OF THE INVENTION

Figure 1A:
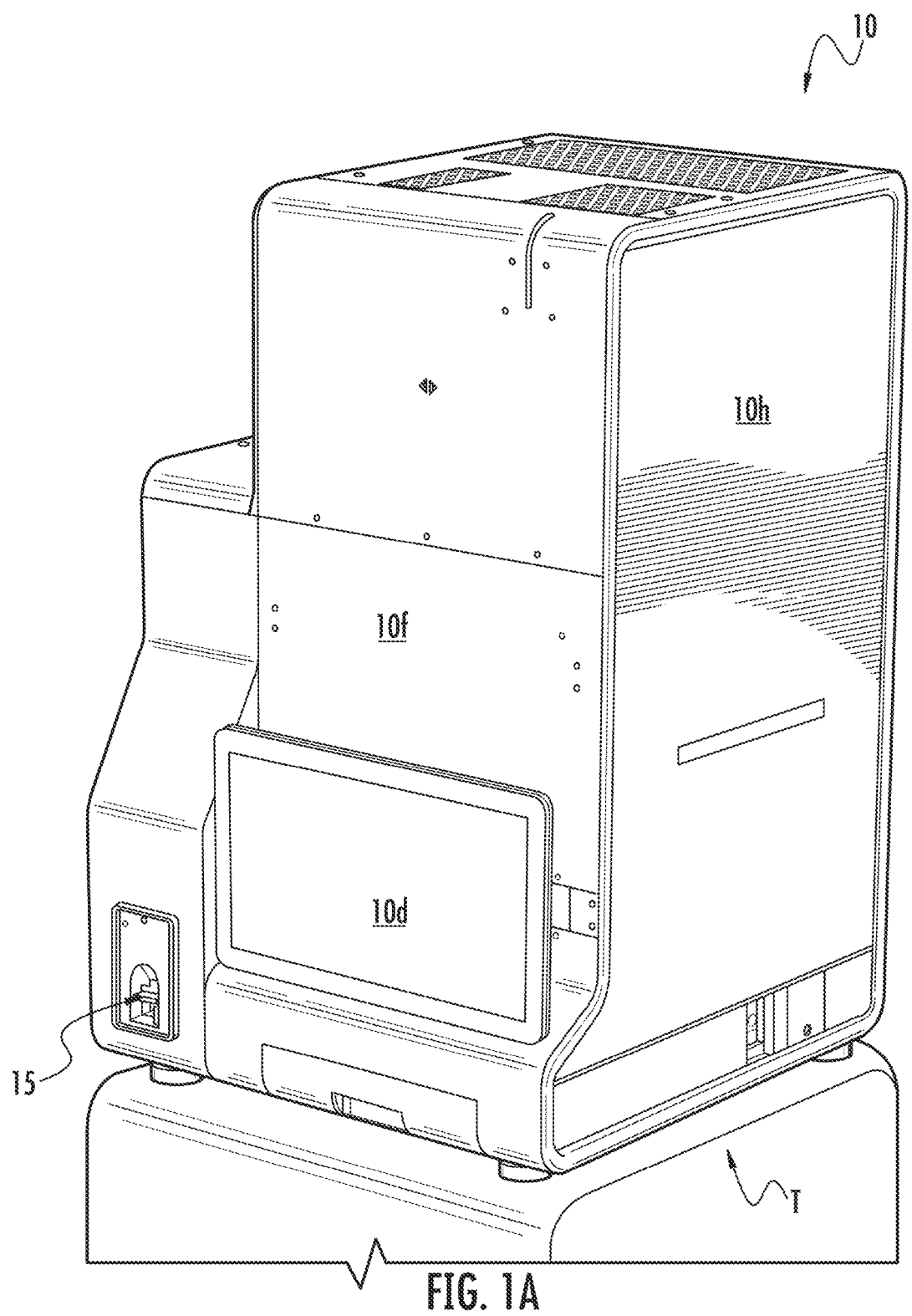
FIG. 1A is a front, side perspective view of an exemplary mass spectrometry system according to embodiments of the present invention.

The present invention now will be described more fully hereinafter with reference to the accompanying drawings, in which illustrative embodiments of the invention are shown. Like numbers refer to like elements and different embodiments of like elements can be designated using a different number of superscript indicator apostrophes (e.g., 10, 10', 10", 10''').

In the figures, certain layers, components or features may be exaggerated for clarity, and broken lines illustrate optional features or operations unless specified otherwise. The terms "FIG." and "Fig." are used interchangeably with the word "Figure" in the application and/or drawings. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass orientations of above, below and behind. The device may be otherwise oriented (rotated 90° or at other orientations) and the spatially relative descriptors used herein interpreted accordingly.

The term "about" refers to numbers in a range of +/−20% of the noted value.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

The term "signal acquisition time" refers to the time that a digital signal of mass spectra of a single sample is collected or acquired from a detector of a mass spectrometer for analysis of the sample.

The terms "time delay" and "delay time" are used interchangeably and refer to a time between laser flash (firing/transmission) and ion extraction, i.e., between ionization and acceleration, for delayed extraction.

In some embodiments, the mass spectrometer is configured to obtain ion signal from a sample that is in a mass range of about 2,000 to about 20,000 Dalton.

The term "pass" refers to a single spectra collection, e.g., one full sweep across a spot. The term "shot" refers to the generation and collection of a single spectra.

The term "sample" refers to a substance undergoing analysis and can be any medium within a wide range of molecular weights. In some embodiments, the sample is being evaluated for the presence of microorganisms such as bacteria or fungi. However, the sample can be evaluated for the presence of other constituents including toxins or other chemicals.

The term "substantially the same" when referencing the peak resolution means that the spectra over a target range, typically between 2 kDa to 20 kDa, between 3 kDa to 18 kDa, and/or between about 4 kDa to 12 kDa, have a resolution that is within 10% of a defined focus mass peak resolution. Examples of focus masses are 4 kDa, 8 kDa, 12 kDa and 18 kDa.

The term "table top" with respect to a sample analysis apparatus refers to a relatively compact unit that can fit on a standard table top or counter top and/or occupy a footprint equivalent to a table top, such as a table top that has a width by length dimensions of about 1 foot by 6 feet, for example, and which typically has a height dimension that is between about 1-4 feet. In some embodiments, the system resides in an enclosure or housing of 28 inches-14 inches (W)×28 inches-14 inches (D)×38-28 inches (H).

The term "module" refers to hardware or firmware, hardware and firmware or hardware (e.g., computer hardware) or software components that carry out defined functionality.

Figure 1B:
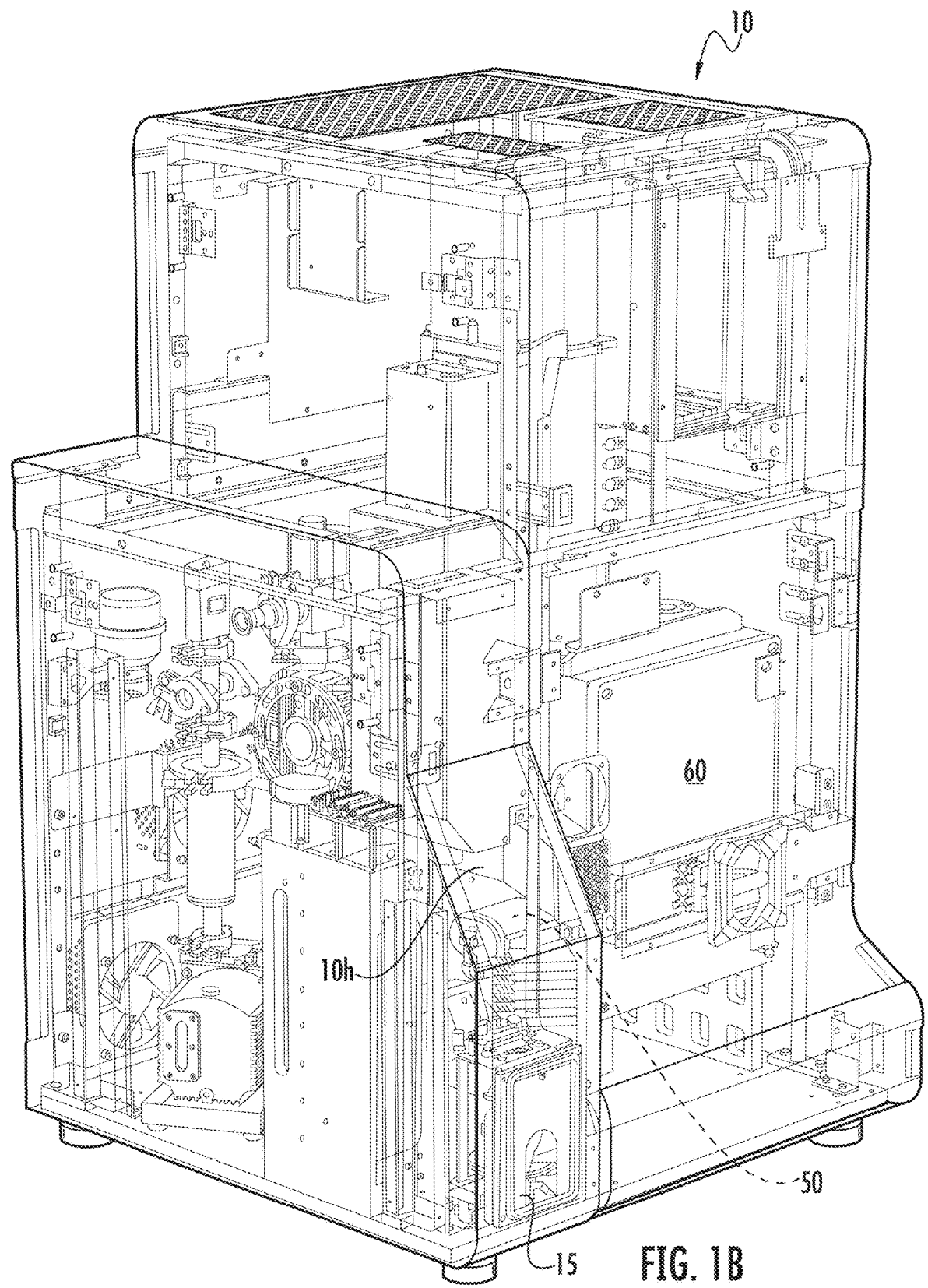
FIG. 1B is a partial front perspective view of the exemplary mass spectrometry system shown in FIG. 1A according to embodiments of the present invention.

FIG. 1A and FIG. 1B illustrate an exemplary mass spectrometer system 10. As shown, the mass spectrometer system 10 includes a housing 10h with a front wall 10f with a display 10d with a user interface and at least one sample specimen port 15, shown as a single port in FIG. 1A and as dual aligned ports in FIG. 1B, sized and configured to serially receive and/or output slides but more than two ports may be used. A respective port 15 can be configured as entry only, exit only, or as both an entry and exit port for specimen slides "S" (FIG. 3A) for analysis. As shown in FIG. 1A, the system 10 can be sized and configured as a table top unit that can reside on a table top T.

Figure 1C:
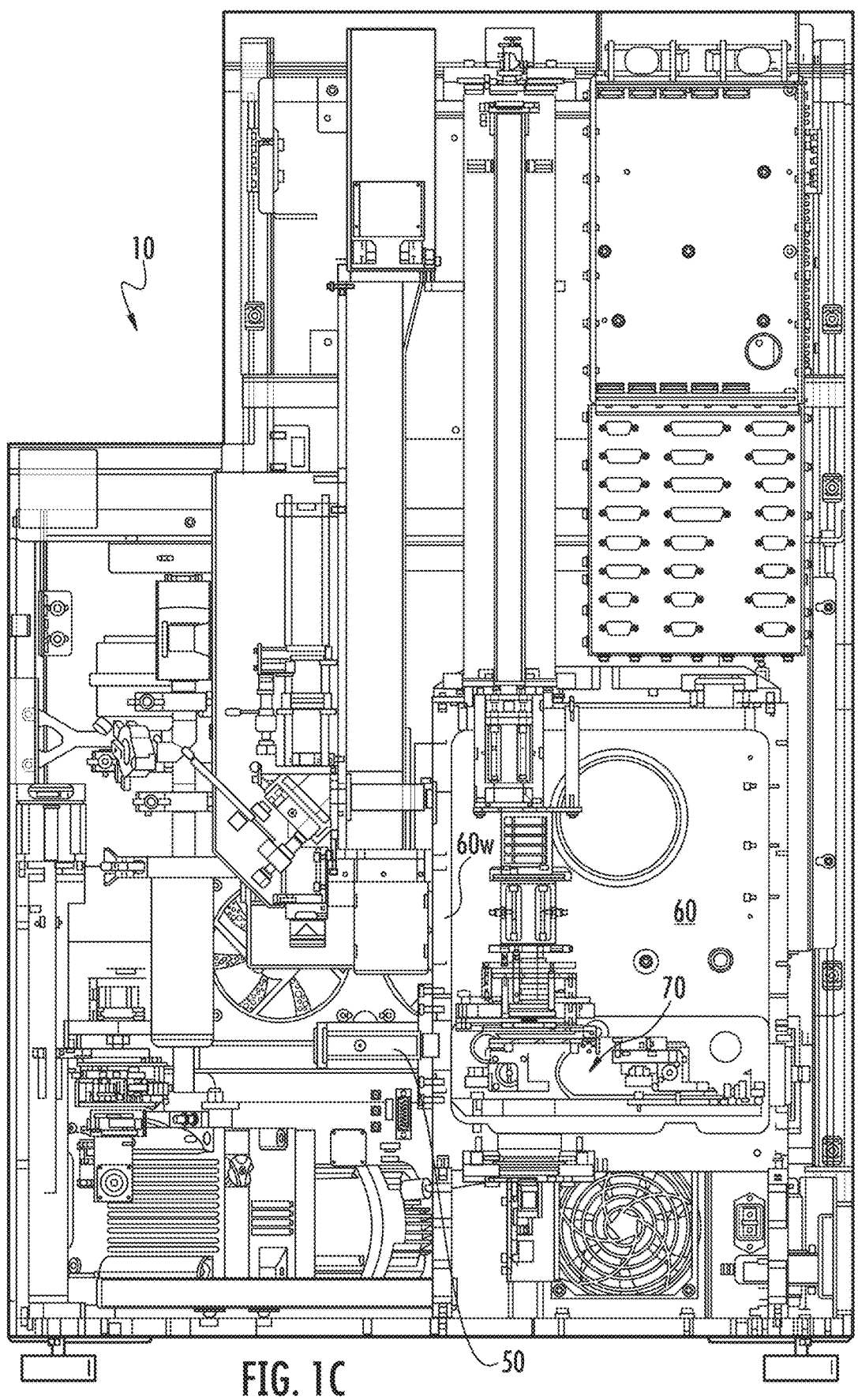
FIG. 1C is a front perspective partial view of the mass spectrometry system shown in FIG. 1A with the external walls removed to illustrate internal components according to embodiments of the present invention.

FIG. 1C illustrates some internal components of the mass spectrometry system 10, shown without the analyzer components (i.e., ionizer, TOF tube (where used) and detector). As shown, the system 10 can include a robot 20 with a slide holder 25, a load lock chamber assembly 50 coupled to a wall 60w of a vacuum chamber 60 and an X-Y stage 70. The term "robot" is used broadly and refers to an electromechanical system with multiple degrees of freedom that can automatically move a respective slide S along various positions in the mass spectrometer system 10. The robot 20 can have an arm 20a that carries out the defined positional movements and is typically affixed to a mounting bracket 20p at a front corner 10c location inside of the housing 10h as shown in FIG. 1B.

As will be discussed further below, the load lock chamber assembly 50 has a load lock chamber 55 with an open channel 55c that can slidably receive a slide S and that can be sealably closed. The load lock chamber 55 can be placed under vacuum (or vented) via one or more valves 56 in fluid communication with the channel 55c and allow a slide S to be input into (and removed from) the vacuum chamber 60 without the vacuum chamber 60 losing vacuum or with a small amount of pressure loss. In the embodiment shown in FIG. 3A, for example, there are two dedicated valves 56, one for venting and one for connection to the vacuum source 156 (FIG. 13B, for example). However, a two-way or three-way valve can be used to carry out the venting and evacuation (not shown).

Figure 2A:
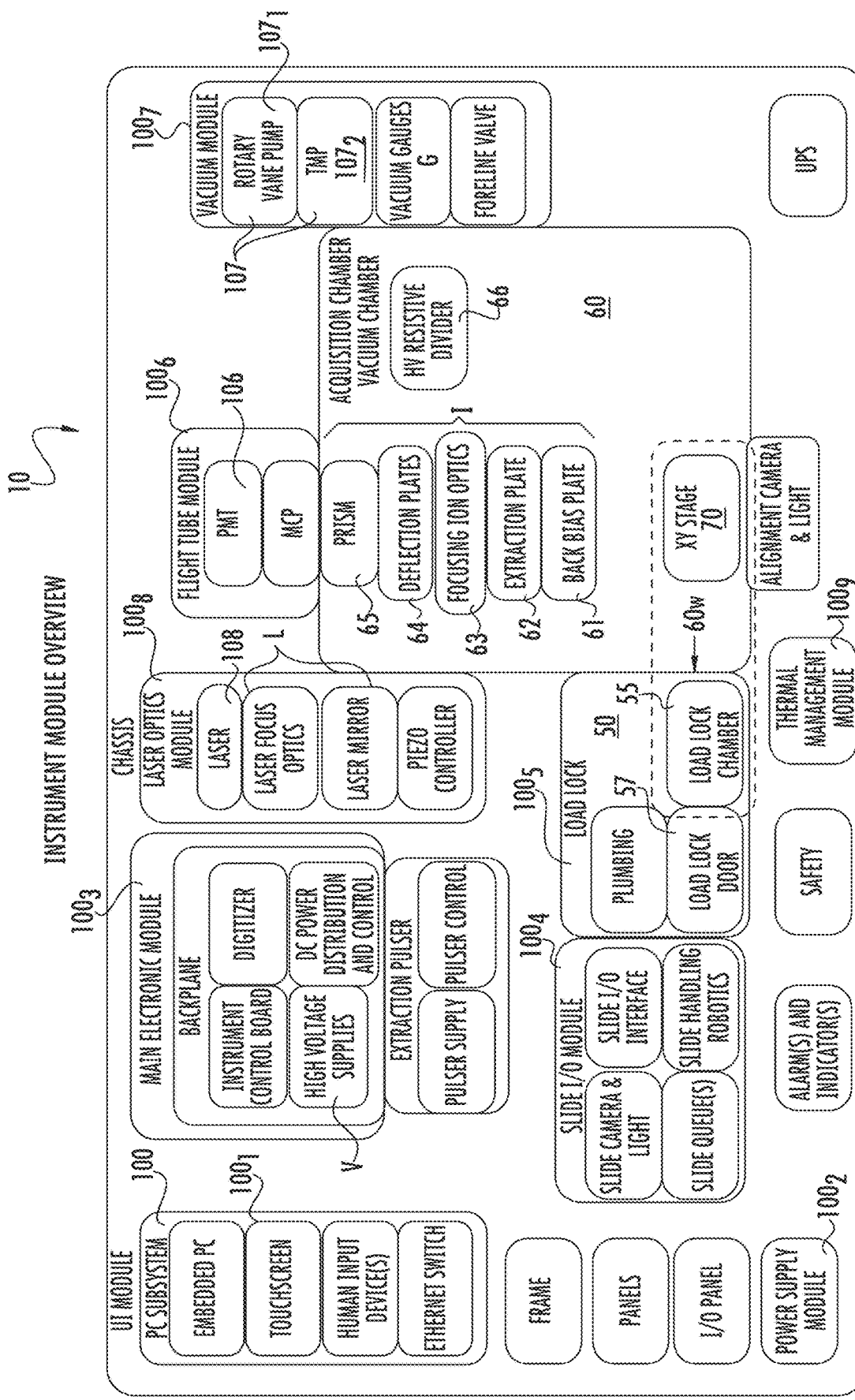
FIG. 2A is a block diagram of a mass spectrometry system illustrating operational modules according to embodiments of the present invention.

FIG. 2A illustrates exemplary operational modules 100 (identified as modules 100n with n being a numerical identifier) that can be included in or on the mass spectrometry system 10. The modules 100 can include a User Interface (UI) module $100_1$, a power supply module $100_2$, a main electronics module $100_3$ (with one or more high voltage supplies V, a digitizer, and an extraction pulser), a slide I/O module 1004, a load lock module $100_5$, a flight tube module 1006, a vacuum module $100_7$ with at least one vacuum pump 107, a laser optics module $100_8$ with at least one laser 108, and a thermal management module $100_9$. The at least one vacuum pump 107 can include a roughing vacuum pump $107_1$ and a turbo pump $107_2$. The turbo pump $107_2$ may only be directly connected to the acquisition vacuum chamber 60 while the roughing pump $107_1$ can be directly connected to the load lock chamber 55c and also, optionally, the acquisition vacuum chamber 60.

FIGS. 2B and 2C illustrate an instrument 10 that includes some or all of the operational modules 100 and related components shown in FIG. 2A. The roughing pump $107_1$ can reside below the turbo vacuum pump $107_2$ in a relatively compact interior space.

The instrument 10 can be held at a positive pressure (outside the vacuum chamber and load lock chamber when under vacuum) to inhibit external air from entering the instrument and/or inhibit contamination of samples from external sources while in the unit 10. The term "positive pressure" refers to a pressure that is above atmospheric pressure external to the instrument so that air flows out of ventilation vents and/or any openings in the skin or casing of the housing instead of in. One or more fans (typically with filters) in the instrument 10 can be used to generate the positive pressure.

As shown in FIGS. 1C and 2A, for example, the load lock chamber 55 is attached to the wall 60w of the vacuum chamber 60. The X-Y stage 70 is in the vacuum chamber 60 along with electronic operational components that guide generated ions or a laser beam, such as a back bias plate 61, an extraction plate 62, focusing ion optics 63, deflection plates 64, and a prism 65. The vacuum chamber 60 may also contain a high voltage (HV) divider 66. The prism 65 can guide the laser beam and the plates 61, 62 can guide the generated ions as is well known to those of skill in the art. In FIGS. 2A and 2C, the laser optics are referred to as "L" and the ion optics are referred to as "I".

FIG. 3A and FIG. 3B illustrate the robot 20 and slide holder 25 at a transfer height ready for load lock handoff with a door 57 of the load lock member assembly 50 open, exposing the open channel 55c. The slide holder 72 of the X-Y stage 70 (FIG. 9B, for example) is already in position in the chamber 55, sealed to the load lock chamber assembly 50, to maintain the vacuum pressure in the vacuum chamber 60. The arm 20a is rotated and positioned at the transfer height in a z-axis direction relative to its input position for this operational configuration. The slide holder 25 can include end grips 25g such that at least a major length of the slide extends forward of the grip 25g and is free. This configuration can facilitate insertion of the slide S into the aligned slide holder 72 of the X-Y stage 70 (FIGS. 4A, 4B). The slide holder 25 (i.e., gripper 25g) can release the slide S to the slide holder 72 and retract to a home position (FIGS. 5A, 5B).

Referring to FIG. 13B, the load lock chamber 55 can have a relatively compact configuration with a length L extending between the slide insertion/extraction end adjacent the door 57 to the end 55e at the wall 60w of the vacuum chamber 60 (i.e., at the front or inner surface of the flange 55f facing the wall 60w) that is in a range of about 75 mm and about 95 mm and a height H that is in a range of about 40 mm and 60 mm. The open channel 55c can be oblong or elongate laterally with a height that is less than a width.

FIGS. 4A and 4B illustrate a slide transfer configuration/position of the robot arm 20a and slide holder 25. In operation, with the X-Y stage 70 in position for slide transfer and with the slide holder 72 extended into the channel 55c of the load lock chamber 55, a vacuum seal 200s (FIG. 9A) of the vacuum seal assembly 200 (FIGS. 8A, 9A) is engaged with the slide holder 72 and the door 57 is closed and sealed shut on the end of the chamber 55c facing the robot 20 and/or front of the housing 10f. A first one of the valves 56 can open and vent the load lock chamber 55 to atmosphere, the load lock door 57 can then open, and the slide handler arm 20a can extend the slide holder 25 into the chamber 55c and can release the slide S to the slide holder 72 (FIG. 11A) of the X-Y stage 70.

Figure 5A:
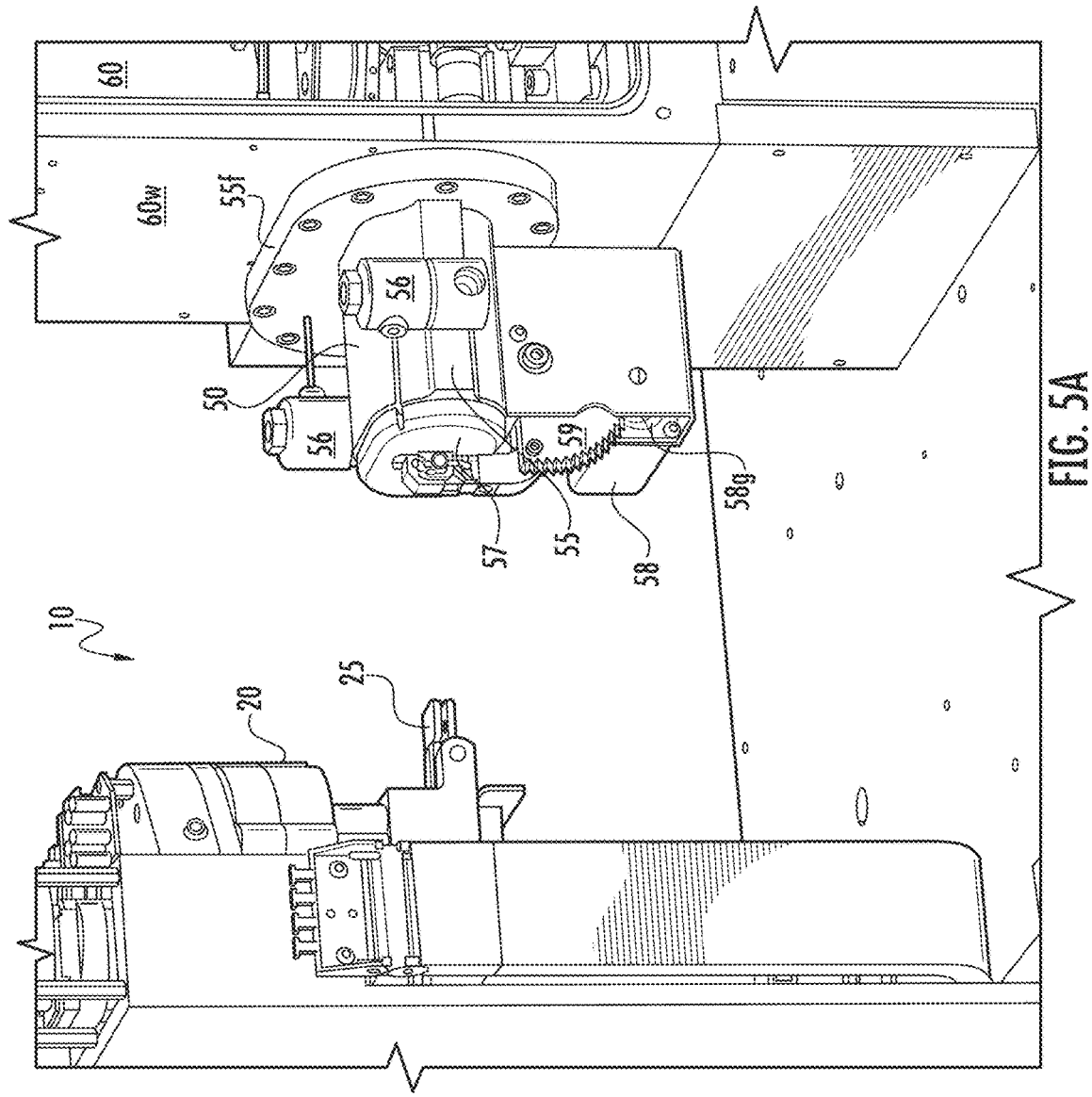
FIG. 5A is a side perspective view of the slide handling system and load lock chamber shown in FIG. 3A, shown with the slide transferred to an X-Y stage and with the load lock door closed configuration according to embodiments of the present invention.
Figure 5B:
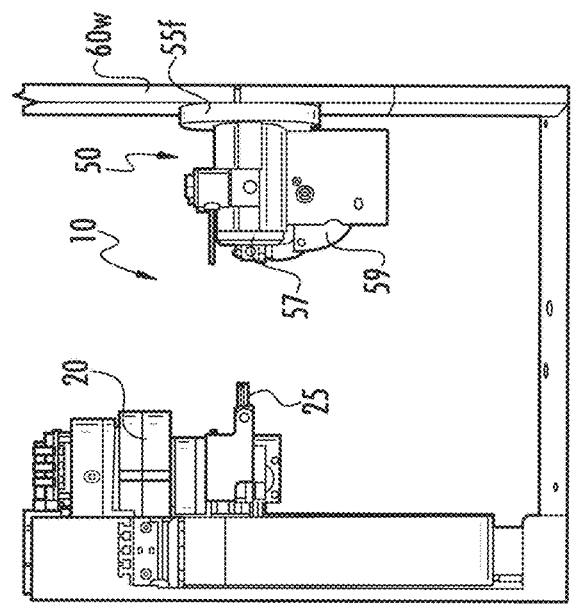
FIG. 5B is a side view of the components and configuration shown in FIG. 5A.

FIGS. 5A and 5B illustrate another operational configuration of the robot 20 with the slide holder 25 and the load lock chamber assembly 50. As shown, the arm 20a with the slide handler 25 is retracted away from the load lock chamber 55 and the door 57 is sealably closed against the load lock chamber 55. A second one of the valves 56 is opened and the load lock chamber 55 can be pumped/evacuated via vacuum pump (i.e., pump $107_1$, FIG. 13B) to a desired pressure, typically at a pressure within a suitable range of the vacuum chamber 60.

Vacuum gauges G (which can be in module $100_7$, FIG. 2) can be used to automate the monitoring and cause the X-Y stage 70 to move the slide holder 72 into the vacuum chamber 60 when a desired pressure is achieved. Once vacuum is at an appropriate level in the load lock chamber 55, the X-Y stage 70 can remove the slide holder 72 from the load lock chamber 55 into the vacuum chamber 60 while the door 57 remains sealably closed against the load lock chamber 55.

In some embodiments, there can be a step in vacuum pressure between the load lock chamber 55 in the load/seal position and the vacuum chamber 60. For example, a sample slide S is loaded into the load lock chamber 55 from outside while the load lock chamber 55 is open to atmosphere with the door 57 open and is also sealed from the acquisition vacuum chamber 60. The load lock chamber 55 is then sealed from the outside by closing the door 57 and roughed down to an intermediate pressure level by the opening of a valve 56 on the load lock chamber assembly 50 (which is typically lower than atmospheric pressure but higher than the pressure in the acquisition chamber 60). The valve 56 is then closed. The load lock chamber 55 is sealed from both outside and from the acquisition vacuum chamber 60 placing the load lock chamber 55 at an intermediate pressure, while acquisition chamber is at a lower operating pressure. The sample stage 70 is retracted into the acquisition chamber 60, breaking the seal between the load lock chamber 55 and the acquisition chamber 60. The two chambers 55, 60 are no longer fluidically separate, so there can be a momentary spike in pressure in the acquisition chamber 60 due to an inrush of air from the previously-sealed load lock chamber 55. After a relatively short amount of time, the pressure in the vacuum chamber 60 reaches an operating level once again.

However, in other embodiments, the load lock chamber 55 can be evacuated to a level matching or below the pressure acquisition chamber 60.

The sequence shown in FIGS. 3A, 4A and 5A can be reversed to remove a slide S after analysis to a storage rack 10r (FIG. 14) inside the housing 10h or to the exit port 15 (FIG. 1A).

The load lock chamber assembly 50 can be mounted to a wall 60w of the vacuum chamber 60 via a flange 55f. The flange 55f can extend outward a distance about a perimeter of an end 55e (FIG. 6A, 7) of the load lock chamber 55 facing the acquisition vacuum chamber 60. Typically, the flange 55f is mounted to the outer surface of the wall 60w, optionally directly mounted to the wall 60w. The wall 60w can face the front wall 10f of the housing 10h (FIG. 1A). The wall 60w can have a groove or ridge 60g that holds an O-ring 160 that can sealingly engage the flange 55f of the load lock chamber 55 (FIG. 7).

The door 57 of the load lock chamber assembly 50 can be an automatic door that is operated without requiring user input and/or manual force. As shown, the door 57 and load lock chamber 55 can be elongated laterally relative to their height. The door 57 can have an inner surface with a seal member 57s such as an O-ring or gasket. The load lock chamber assembly 50 can include a stepper motor 58 with a shaft 58s that rotates a first gear 58g that engages a second gear 59 to automatically open and close the door 57.

Figure 9B:
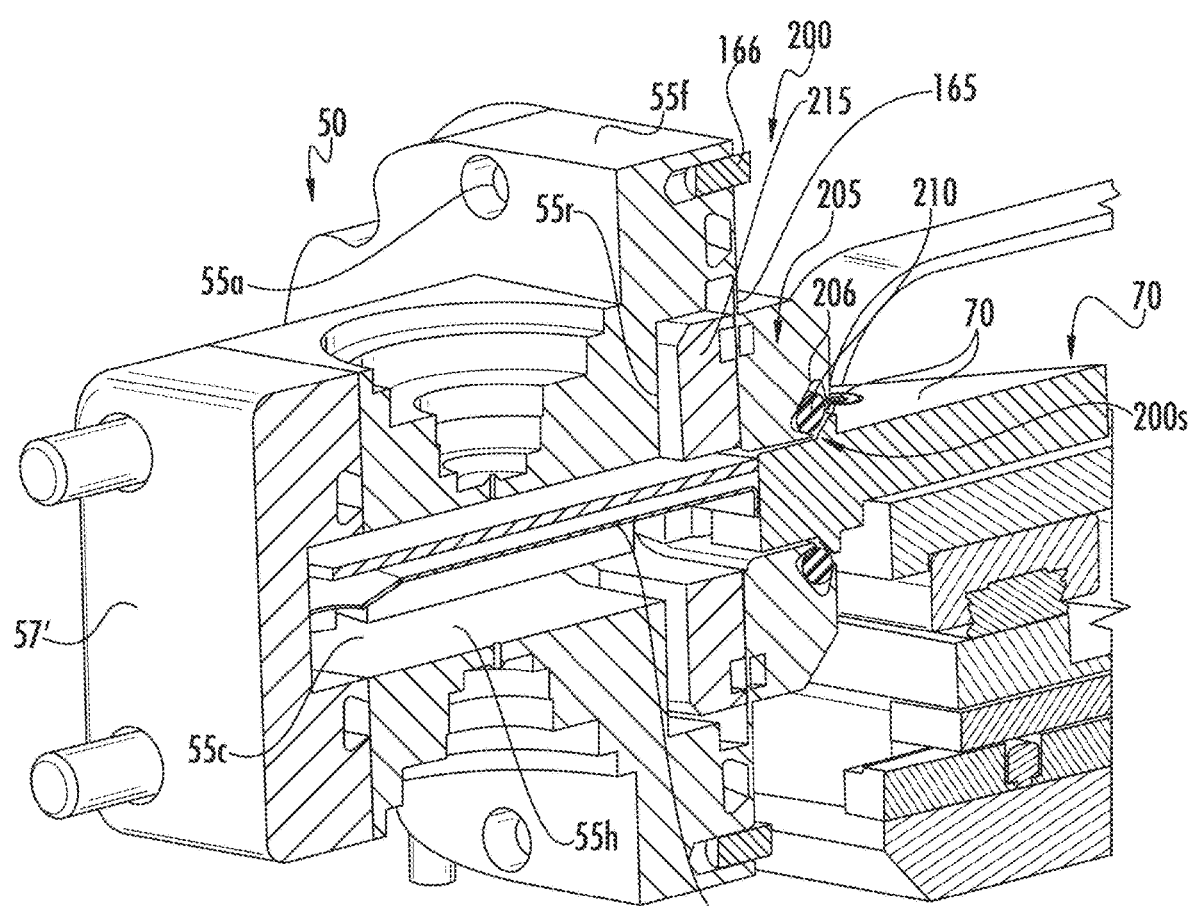
FIG. 9B is a section view of the load lock chamber assembly according to embodiments of the present invention.

FIGS. 9A and 9B illustrate another example of a door 57' that can slide on rails to open and close the outer facing end of the load lock chamber 55.

Figure 6A:
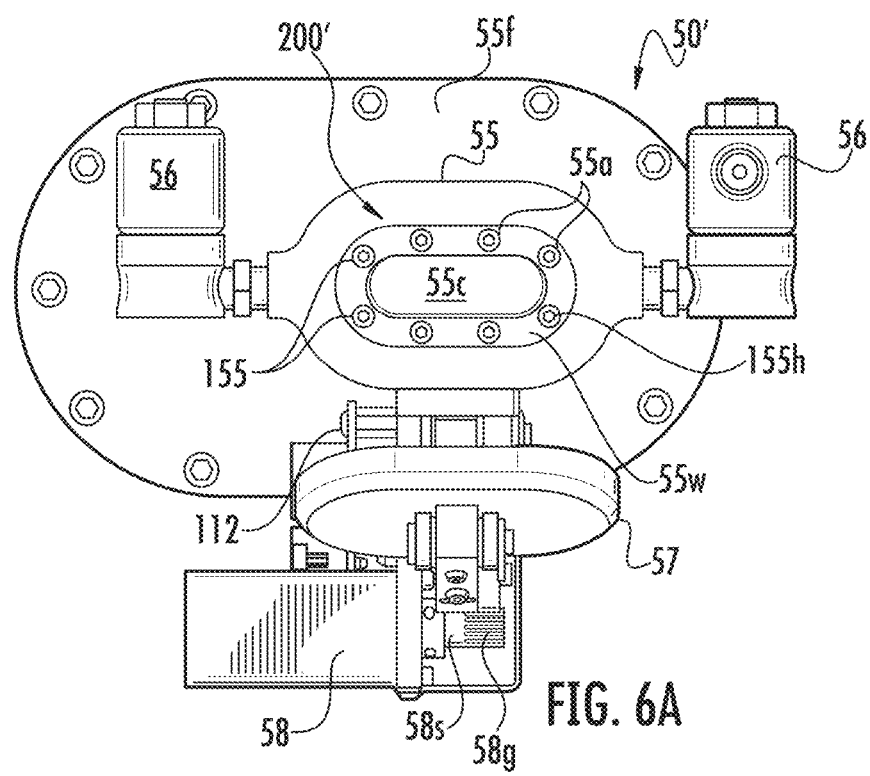
FIG. 6A is an end view of another embodiment of the load lock chamber assembly illustrating a seal assembly cartridge according to embodiments of the present invention.
Figure 7:
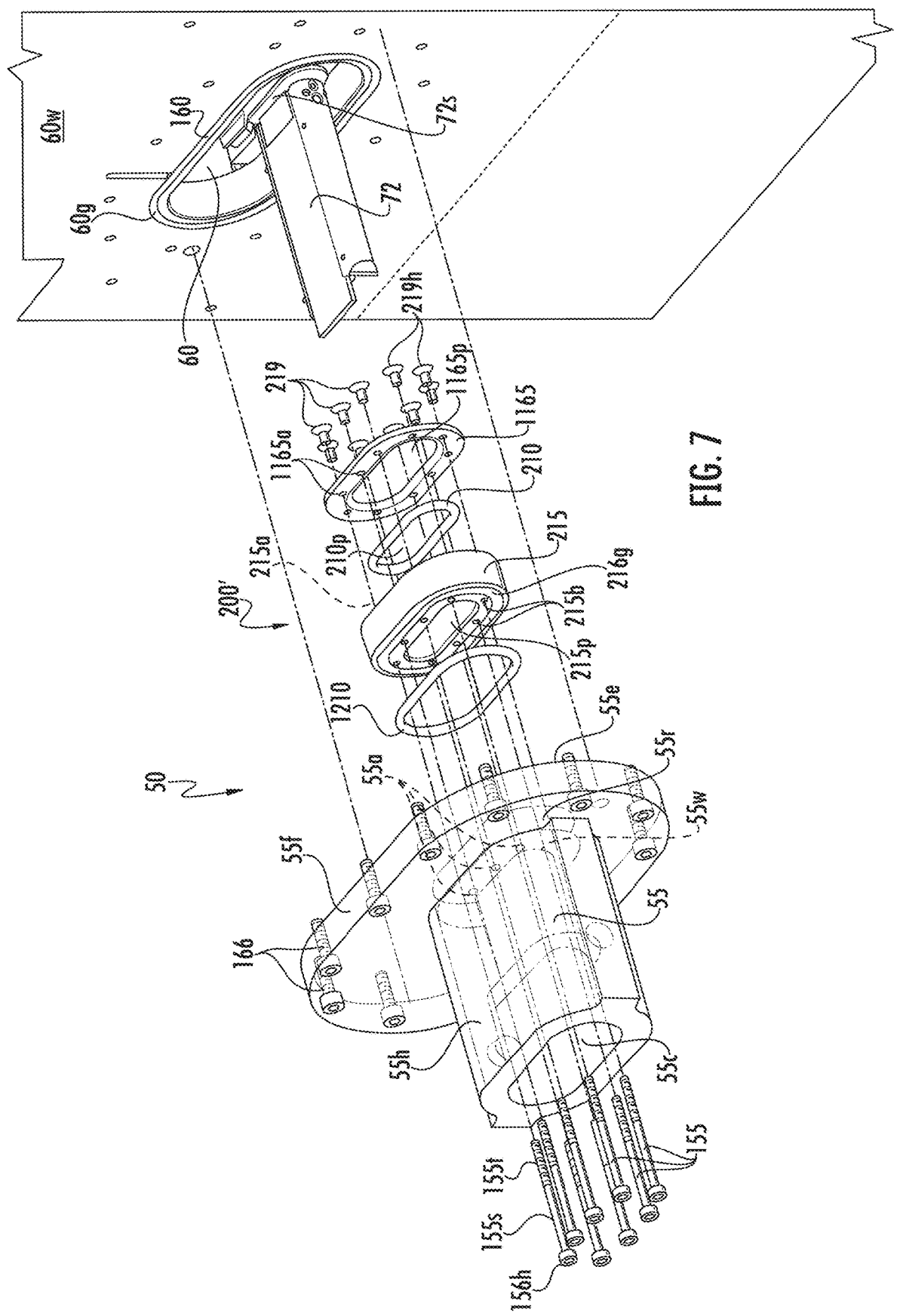
FIG. 7 is a partial exploded view of the load lock chamber assembly shown in FIG. 6A.
Figure 13A:
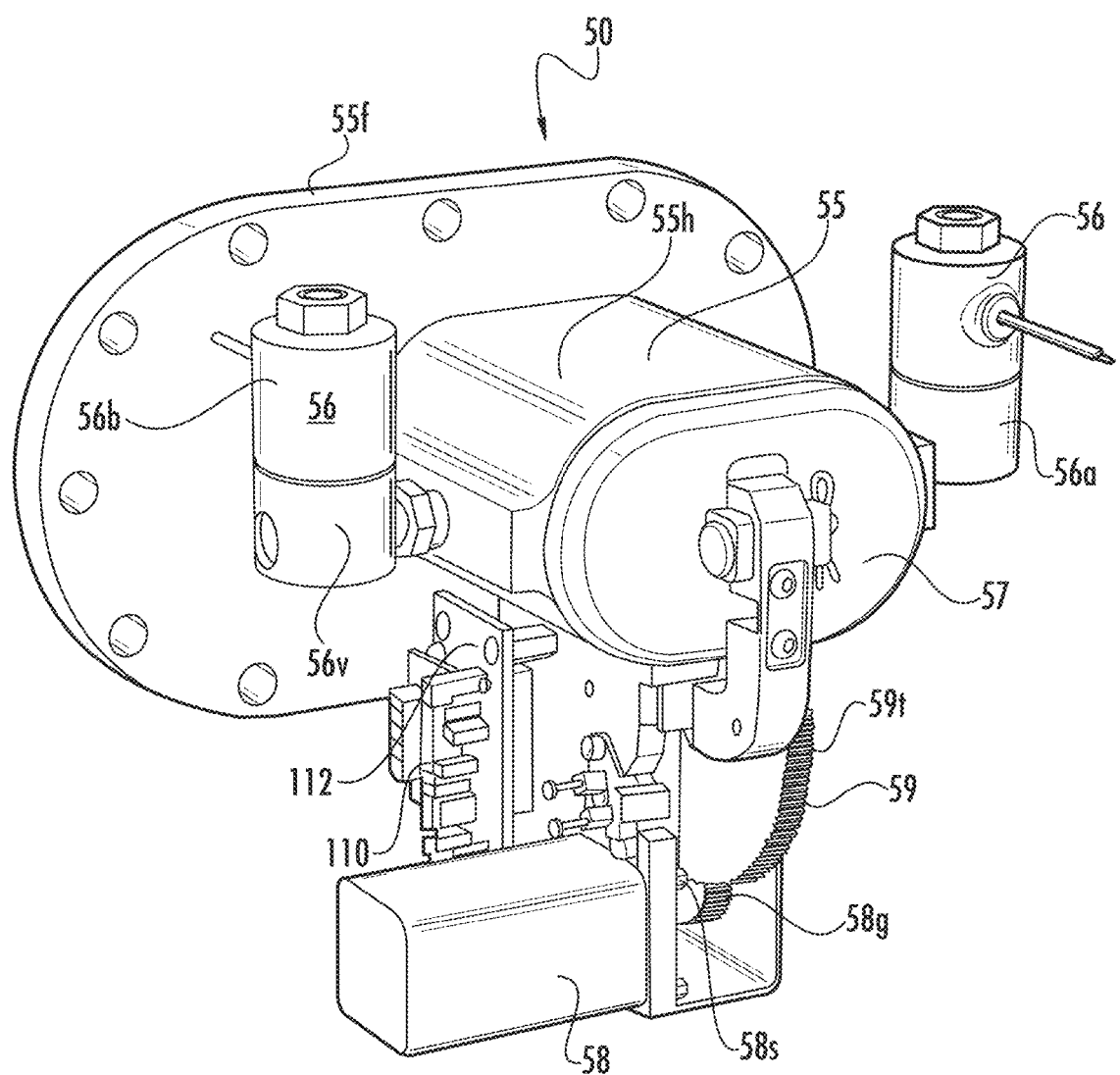
FIG. 13A is an end, side perspective view of the load lock chamber assembly according to embodiments of the present invention.

As shown in FIGS. 6A and 13A, a control circuit 110, which can be at least partially on a printed circuit board 112 that can be mounted adjacent the step motor 58 and can provide the automatic electronic control for opening and closing the at least one valve 56 and opening and closing the door 57.

Referring to FIGS. 8A-8D, 9A and 9B, a seal assembly cartridge 200 of the load lock chamber assembly 50 is shown. In this embodiment, the seal assembly cartridge 200 includes a flexure member 165, a first seal housing member 205 with an open port 205p and a channel 206 extending about a perimeter of the port 205p holding an O-ring 210 (or other seal member) which can protrude from the channel 206. The first seal housing member 205 can be rigid and the flexure member 165 can be a solid (impermeable) single layer or multi-layer member and can have less structural rigidity so that it is able to flex (deflect) under normal operating conditions when exposed to pressure changes associated with venting and evacuation.

Referring to FIG. 9A, in position, the flexure member 165 resides between the first housing member 205 and the housing 55h of the lock load chamber. The flexure member 165 can reside between the first seal housing member 205 and the flange 55f of the load lock chamber 55. The flexure member 165 can have a perimeter with spaced apart apertures 165a. Pins 166 can be used to secure the flexure member 165 to the wall 60w of the vacuum chamber 60. The flexure member 165 can have a height "h" that is greater than the height of the first seal housing 205 and/or the seal housing port 205p. The flexure member 165 can have a laterally elongate aperture 167 that has a shape and size corresponding to the port 205p.

The flexure member 165 can comprise or be a single or multi-layer member of a thin material such as, for example, stainless steel sheet, i.e., a diaphragm, and may eliminate over constraints of mechanical components without requiring expensive over tolerance components. The term "thin" refers to a thickness between about 0.00001 mm and about 2 mm.

Figure 8A:
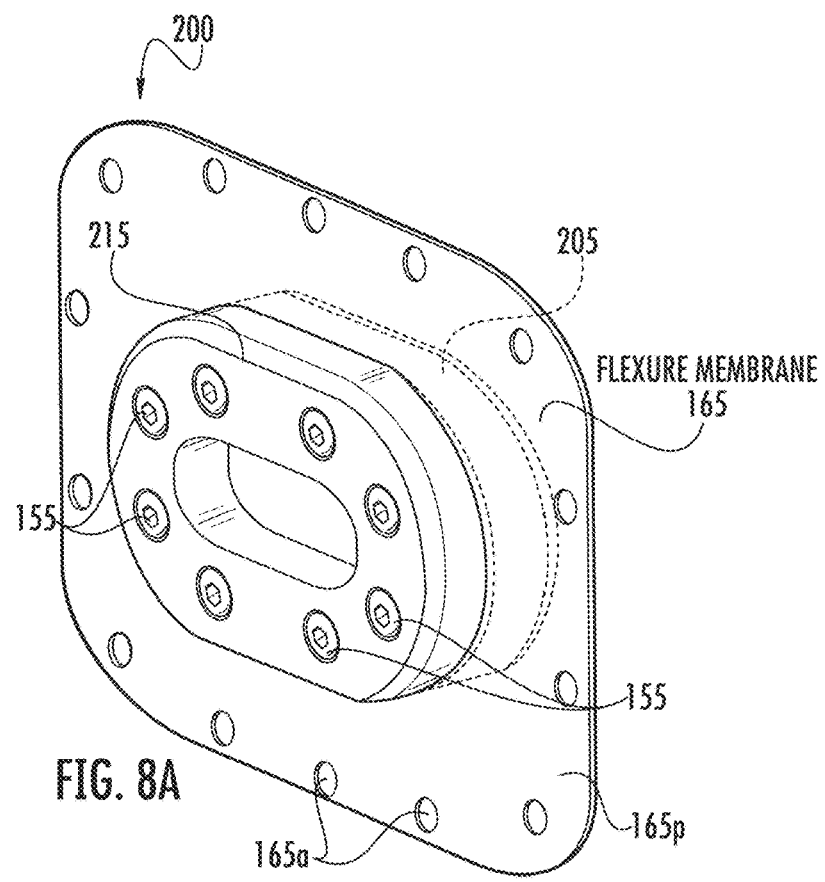
FIG. 8A is a load lock side view of a seal assembly cartridge according to embodiments of the present invention.
Figure 8B:
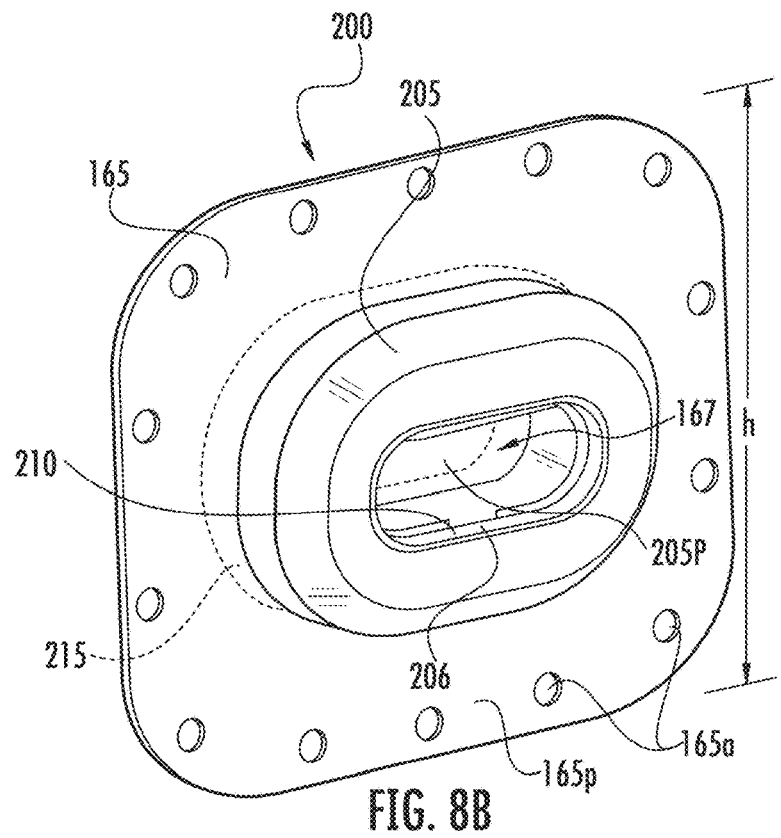
FIG. 8B is a vacuum chamber side view of the seal assembly cartridge shown in FIG. 8A according to embodiments of the present invention.
Figure 8C:
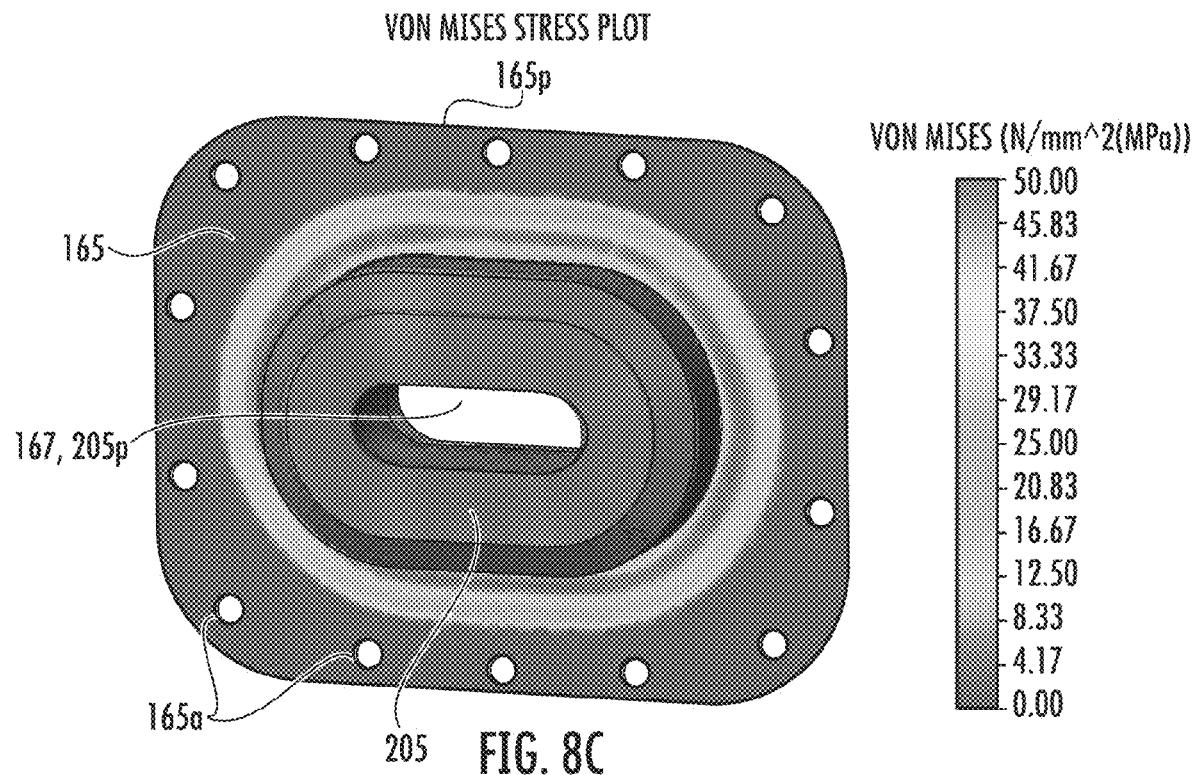
FIG. 8C is a vacuum chamber side view of the seal assembly cartridge shown in FIG. 8B with a von Mises stress plot (N/mm$^2$ (MPa)) illustrating predicted stresses that may be applied during operation according to embodiments of the present invention.
Figure 8D:
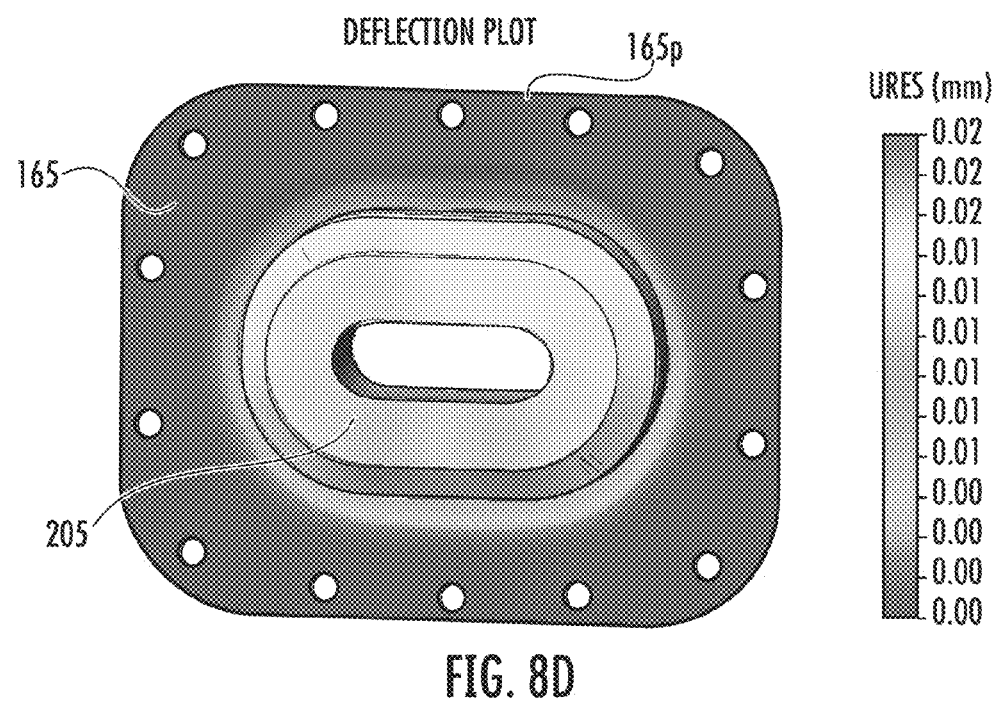
FIG. 8D is a vacuum chamber side view of the seal assembly cartridge shown in FIG. 8B with a deflection plot (URES, mm) illustrating predicted deflection that may be applied during operation according to embodiments of the present invention.

FIGS. 8A and 8B illustrate opposing sides of the first seal housing member 205 and the flexure member 165. The load lock chamber facing side is shown in FIG. 8A and illustrates that fixation members 155 can be used to affix the load lock chamber 55 to the vacuum chamber 60. The fixation members 155 can be screws with screw heads 155h accessible via the load lock channel 55c when the door 57 is open (FIG. 6A). FIG. 8C illustrates a von Mises stress plot (N/mm$^2$ (MPa)) and FIG. 8D is a deflection plot (URES, mm from 0.00 to 0.02 mm) with maximal deflection and stresses of the flexure member 165 adjacent the port 205p and with no deflection at the perimeter 165p of the flexure member 165 from a finite element analysis that predicts deflection and stresses on the flexure member 165 about the port 205p (yield stress can, in some embodiments, be between 100 MPa and 500 MPa, such as about 207 MPa in some particular embodiments).

FIGS. 8A, 8B and 9B illustrate that the seal assembly cartridge 200 can include a second seal housing 215 that can be coupled to the first seal housing 205 with the flexure member 165 sandwiched therebetween. FIG. 9B illustrates that the second seal housing 215 can reside in a recess 55r in the primary housing 55h of the load lock chamber 55.

Figure 6B:
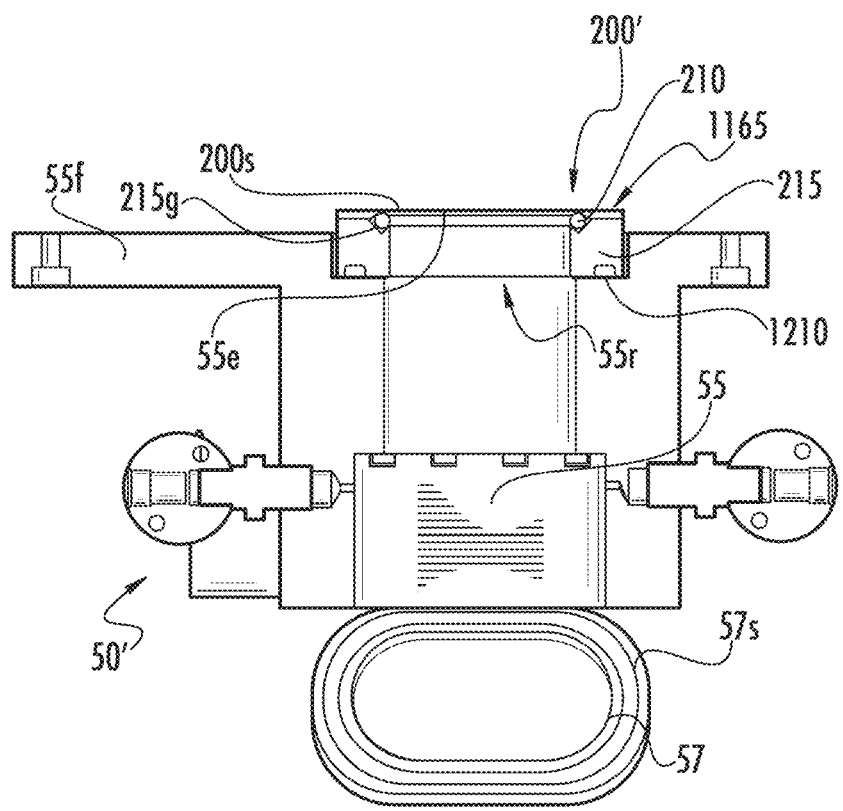
FIG. 6B is a top view of the load lock chamber assembly shown in FIG. 6A according to embodiments of the present invention.

FIGS. 6A, 6B and 7 illustrate another embodiment of the seal assembly cartridge 200'. As shown, the seal assembly cartridge 200' includes a seal housing member 215 coupled to a retention member 1165 with an O-ring 210 or other seal member such as a gasket therebetween, all with (laterally elongate) open ports 215p, 210p, 1165p that align to form part of and/or attach to the load lock chamber 55c.

Figure 12:
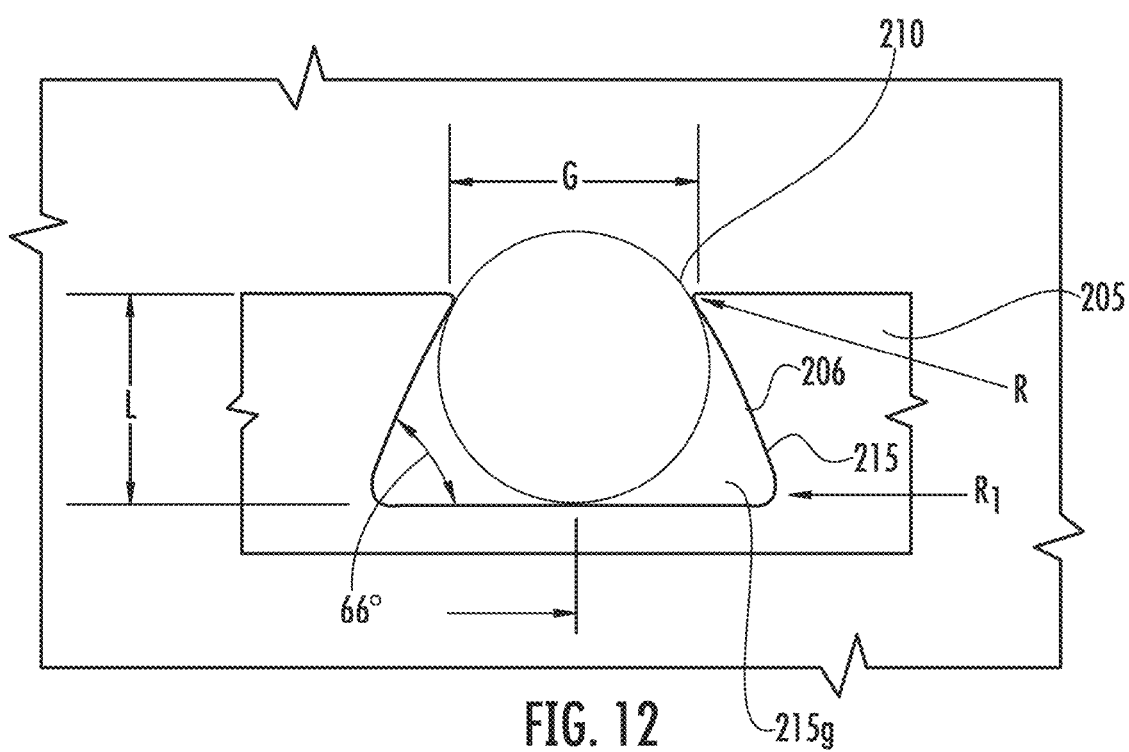
FIG. 12 is a side view of a portion of a housing of the seal cartridge sub-assembly according to embodiments of the present invention.

As shown in FIGS. 7 and 12, the seal housing member 215 can include a groove 215g on an acquisition vacuum chamber facing surface that holds the O-ring 210. The seal housing member 215 and the retention member 1165 can include a cooperating set of apertures 215a, 1165a that align with a first set of fixation members 219 that can attach the components 215, 1165 together as a cartridge subassembly. The heads 219h of the fixation members 219 can face outward toward the vacuum chamber 60.

As shown, the seal housing member 215 can also include a groove 216g holding an O-ring 1210 or other seal member on a door facing surface. The groove 216 can be concentric with the first groove 215g and the O-ring 1210 can have a larger perimeter size than the first O-ring 210.

The seal housing member 215 can include a second set of apertures 215b that are spaced apart about a wall segment adjacent to and extending about the port 215. Fixation members 155 can extend through the chamber 55c (when the door 57 is open) into through apertures 55a in a wall 55w (FIG. 6A) that is accessible via the through channel 55c proximate a recessed portion 55r of the housing 55h. The seal housing member 215 can reside in the recess 55r (FIG. 6B). The fixation members 155 can be used to attach the cartridge assembly 200' to the wall 55w apertures 215b of the seal housing member 215 when aligned. The second set of apertures 215b can be closer to the port 215p than the first set of apertures 215a. The fixation members 155 that can be inserted via the chamber 55c can have a greater length than the fixation members 219 attached to the retention member 1165 and the other side of the seal housing member 215. As shown in FIG. 7, there can be a greater number of fixation members 219 than fixation members 155, but the same or the reverse can also be true. The number of fixation members 219, 155 can be between 4-12, more typically between 8-12, shown as 10 and 8, respectively, which can be equally spaced apart. Other numbers of fixation members may also be used.

The fixation members 155 can hold the seal assembly cartridge 200' at a first nominal position relative to the X-Y stage slide holder 72 before the fixation members 155 are tightened down to provide a fixed operative second position that can be offset side to side and/or up and down relative to the first nominal position. In some embodiments, the seal assembly cartridge 200' can have some movement capability, typically in a range of 0.1 mm and 0.5 mm, typically about ±0.3 mm of play in a mounting plane, side to side and up and down, when the fixation members 155 screws are in a loosened state but attached to the seal housing 215 or 205. That is, there can be a total adjustable range of 0.6 mm up/down and left/right. The fixation members 155 can have a shaft 155s with only a sub-portion threaded 155t, typically less than 50% of the length of the shaft is threaded.

The load lock housing 55h can be precisely located to the acquisition vacuum chamber 60 by fixation members 166 (FIGS. 7, 9A, 9B).

The vacuum seal 200s provided by the seal assembly cartridge 200, 200' can be allowed to float at installation. The X-Y stage 70 can then be moved to a load lock chamber seal position which can move the vacuum seal 200s, via a seal housing 205 or 215 or via the seal assembly cartridge 200, 200' to align with the seal interface 72s of the slide holder. The fixation or attachment members 155 can then be tightened via access through the open door 57 to the load lock chamber 55. The load lock chamber assembly 50 can reduce the number of O-ring seals and components used compared to other designs.

FIGS. 9B and 12 illustrate that the channel 206 or groove 215g can have a Parker Dovetail cross section configuration that can trap the O-ring 210, while allowing the O-ring 210 to protrude therefrom when not compressed. The O-ring 210 can, in some particular embodiments, have a Shore A hardness that is between 50-90.

The cartridge seal assembly 200, 200' can be configured to have a lineal seal force/inch that is between 2-10 pounds. The radius R (FIG. 12) can be about 0.010 (for an O-ring size AS568A, 201-284), with a ⅛ nominal cross section and gland depth L of between about 0.111-0.113 for a desired squeeze of about 20%. The radius R may be important to extend life, reduce wear or inhibit assembly damage. Also, excessive radius can cause undesirable extrusion during use. R1 is larger than R and may be between 0.005 inches to about 0.25 inches, such as, for example, about 0.03 inches, in some embodiments.

Upon contact with the seal surface 72s of the slide holder 72, the O-ring 210 can compress, typically about 20%, between the channel 206 or groove 215g and the seal surface 72s forming a suitable vacuum seal 200s. In some embodiments, the O-ring 210 can be oblong (elongate in the lateral direction) and may have a laterally extending perimeter length in the channel 206 or groove 215g that is between 4-6 inches, typically about 4-5 inches, such as about 4 inches, about 4.5 inches and about 5 inches.

In some embodiments, for a 60A durometer O-ring, the vacuum seal assembly 200 can be configured to have a 5 lb/lineal inch of seal that will provide about a 20% compression (5 lb/in×4.49 inches=22 lb). However, it is contemplated that other forces and different durometer O-rings may be used. Higher durometer O-rings can use higher seal forces, for example. It is also contemplated that other seal interfaces and configurations may be used.

Figure 10A:
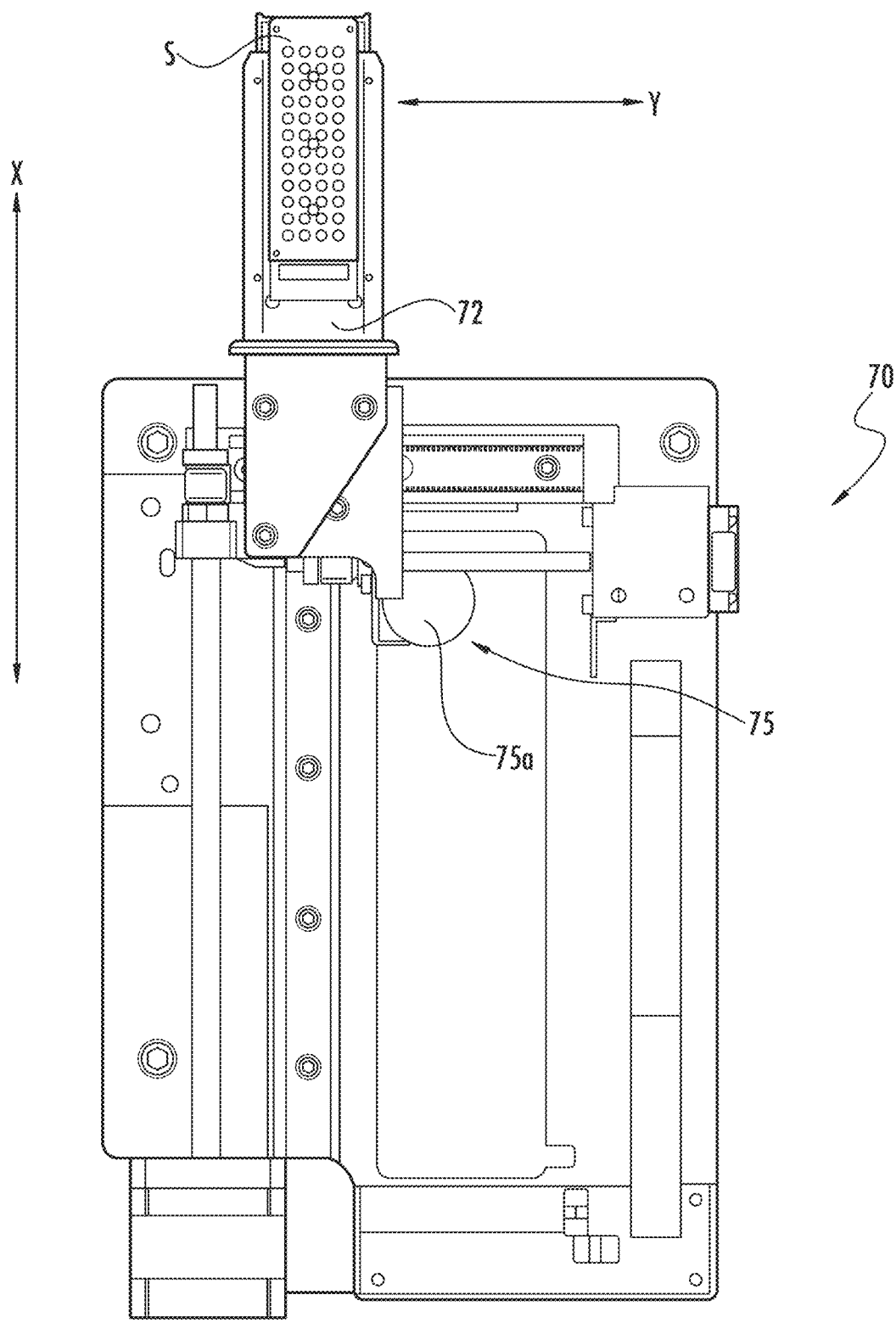
FIG. 10A is a top view of an X-Y stage according to embodiments of the present invention.
Figure 10B:
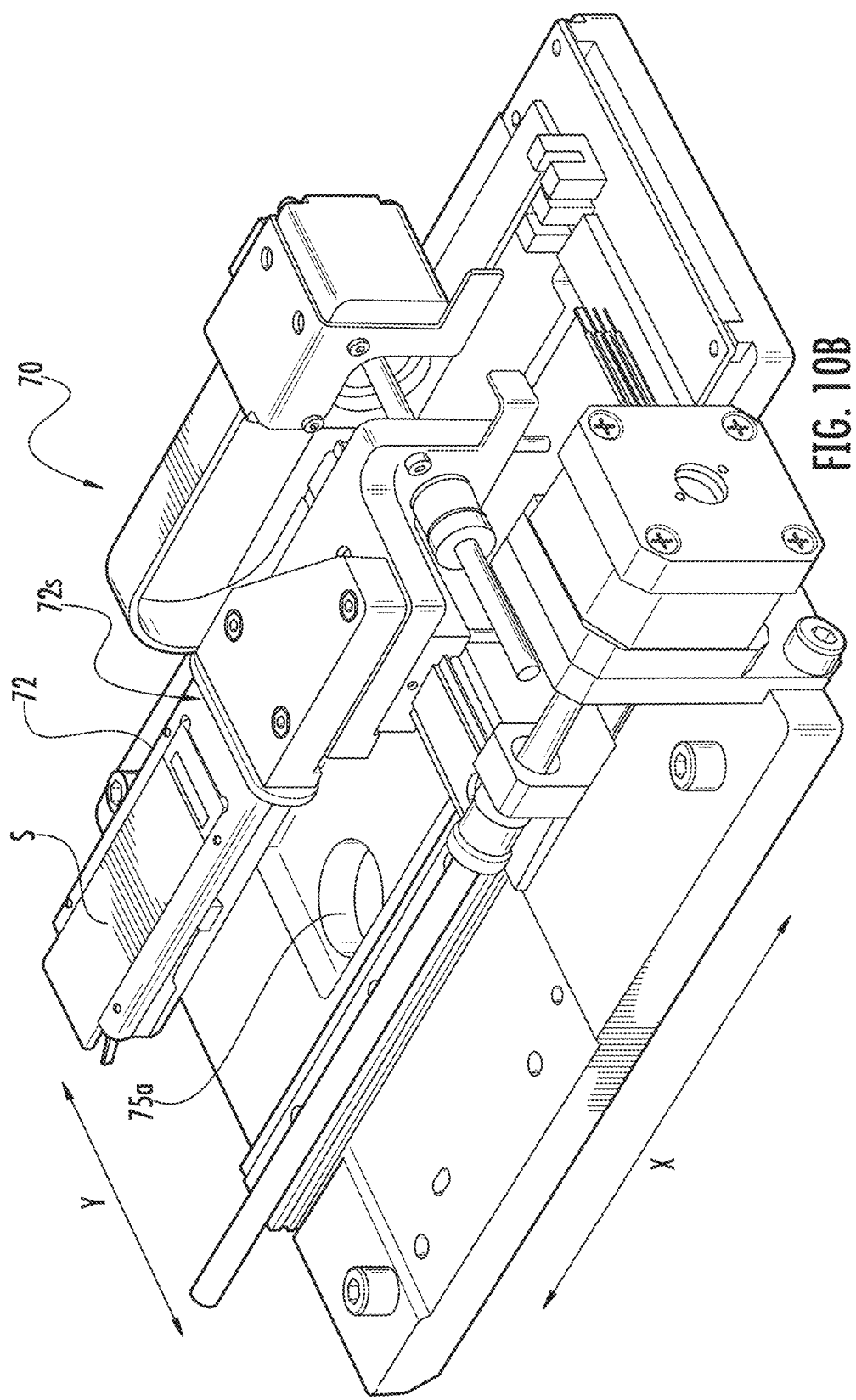
FIG. 10B is a side perspective view of the X-Y stage shown in FIG. 10A.

Referring now to FIGS. 10A-10D, exemplary X-Y stages and components thereof are shown. FIG. 10A illustrates the X-Y stage 70 at a load/lock/seal configuration with the slide holder 72 extended in the X-direction and moved laterally in the Y-direction relative to an aperture 75a associated with the scanning center location 75. FIG. 10B illustrates the slide holder 72 retracted in the X-direction and moved laterally closer to the aperture 75a of the scanning center 75 relative to the position shown in FIG. 10A.

Figure 10C:
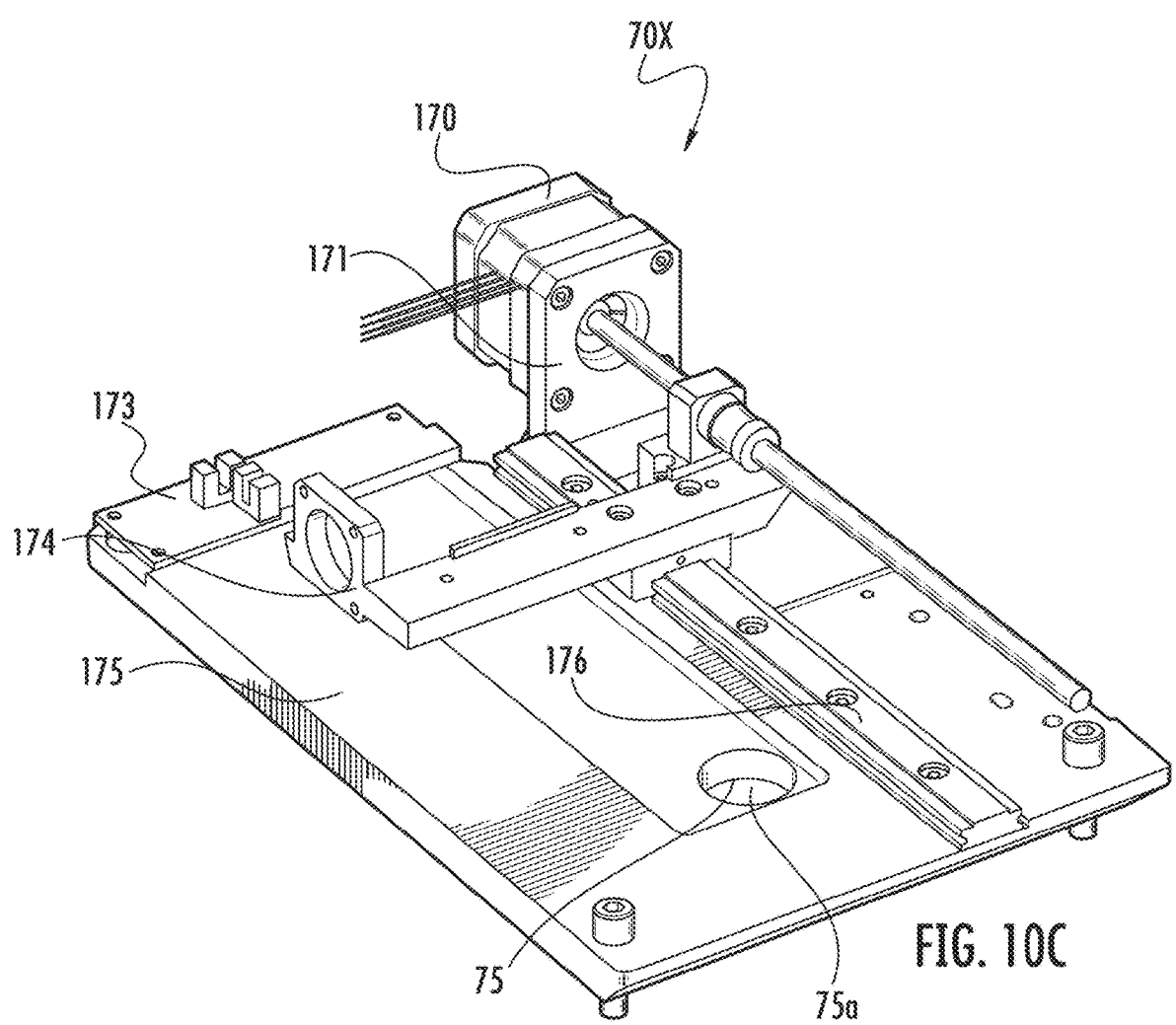
FIG. 10C is a top perspective view of the X-axis components of the X-Y stage according to embodiments of the present invention.

FIG. 10C illustrates exemplary X-stage components 70X of the X-Y stage 70. As shown, these include an x-stage (x-axis) stepper motor leadscrew drive 170, a motor mount 171, an X/Y sensor and interconnect PCB 173, an X-stage carriage 174, a baseplate 175, and an X-stage bearing and block 176.

FIG. 10D illustrates exemplary Y-stage components 70Y of the X-Y stage 70. As shown, these include a y-stage (y-axis) motor and ground flex cable 177, a y stepper motor leadscrew drive 178, a y-stage carriage 179, a y-stage bearing and block 180, an X-stage carriage member (with integrated Y motor mount) 181, a Y home flag 182, an X home flag 183 and the sensor and interconnect PCB 173.

Figure 11A:
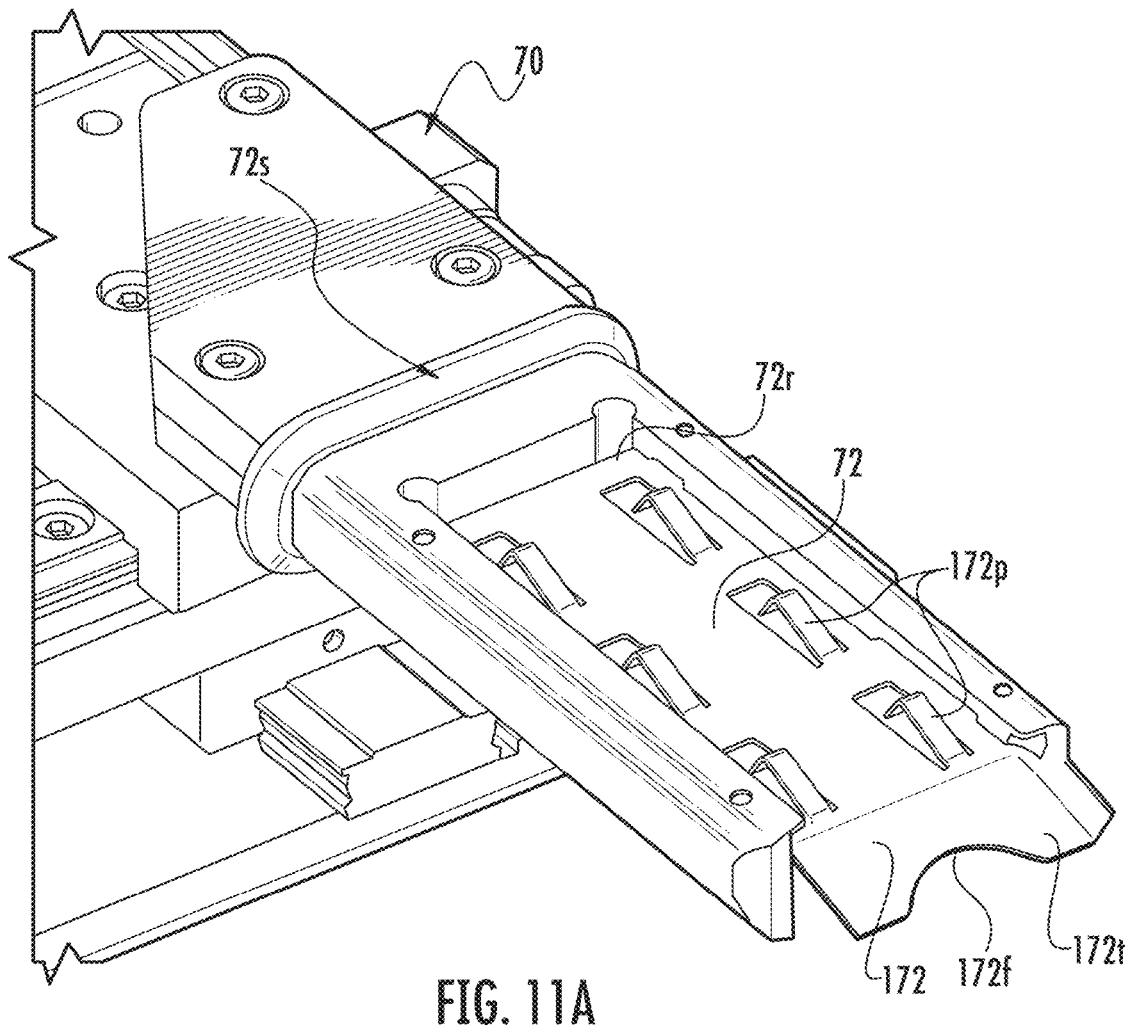
FIG. 11A is an enlarged top, perspective view of a vacuum seal interface of a slide holder of the X-Y stage according to embodiments of the present invention.
Figure 11B:
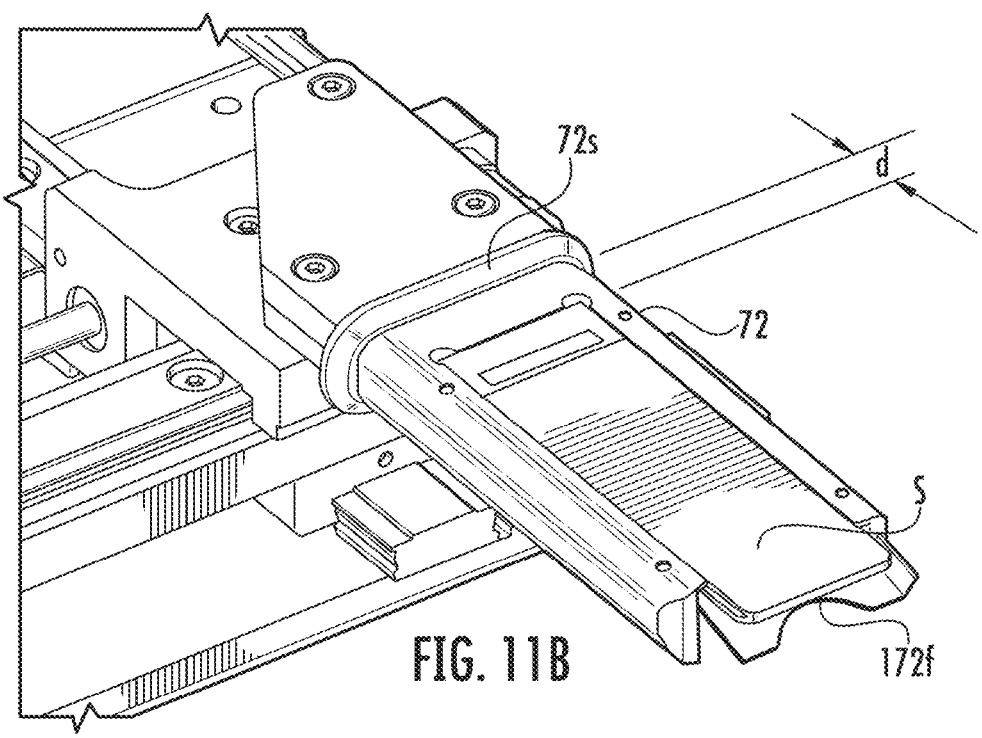
FIG. 11B is a side perspective view of the slide holder shown in FIG. 11A holding a slide according to embodiments of the present invention.

FIGS. 11A and 11B are enlarged views of the sealing surface/interface 72s of the slide holder 72. As shown, this sealing surface 72s can be angled to provide an enlarged vacuum sealing area and/or allow for self-centering alignment with the load lock chamber 55c via the seal assembly cartridge 200, 200' to provide a suitable vacuum seal for interface 200s. This surface 72s can be electro-polished and may be formed as a single piece unitary stainless steel slide holder 72 with this integrated sealing surface 72s which can reduce or eliminate build-up tolerances of multi-component designs.

The (vacuum/load lock chamber) sealing surface 72s (also known interchangeably described as a seal interface) can extend laterally about an entire perimeter of the slide holder 72 and can have radially extending opposing arcuate ends that are spaced apart in a lateral dimension. This full radius sealing surface 72s can reduce pressure needed to seal by eliminating sharp corner bulges in rectangular shaped sealing perimeters.

The sealing surface 72s can reside longitudinally spaced apart a distance of between about 0.1 inches and about 1 inch from a recess region 72r of the slide holder 72 that holds an end of a respective slide S (FIG. 11B).

The slide holder 72 can comprise a slide capture flat form spring 172 held in the recess 72r of the slide holder 72. The spring 172 can comprise upwardly extending flex prongs 172p with a tapered front end 172t for ease of slide entry and removal by the slide holder 25 (FIG. 1A). Suitable flat form springs are available from Spring Manufacturing Corporation, Tewksbury, Mass. The slide S can be loaded from the top (slid in from the top tapered end 172*t*) for consistent slide height, slide to slide. A finger cutout 172*f* can facilitate slide grip access for removal of the slide.

Figure 13C:
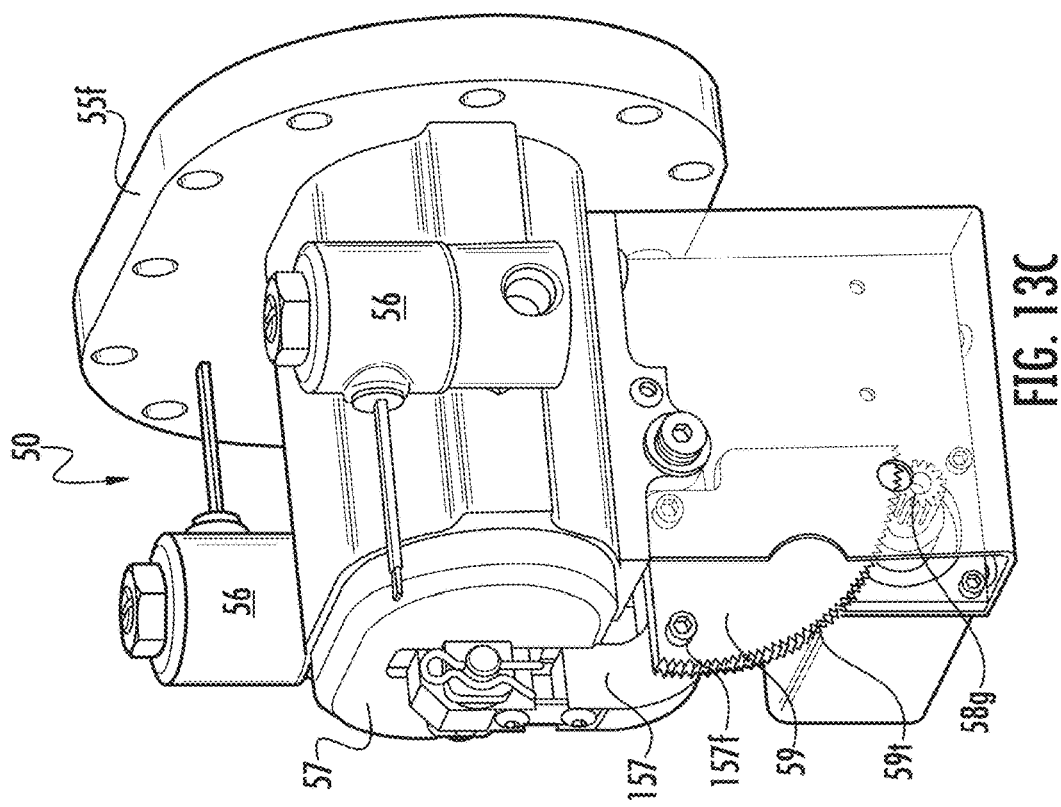
FIG. 13C is a side perspective view of the load lock chamber assembly shown in FIG. 13B, but shown with the door closed.
Figure 13B:
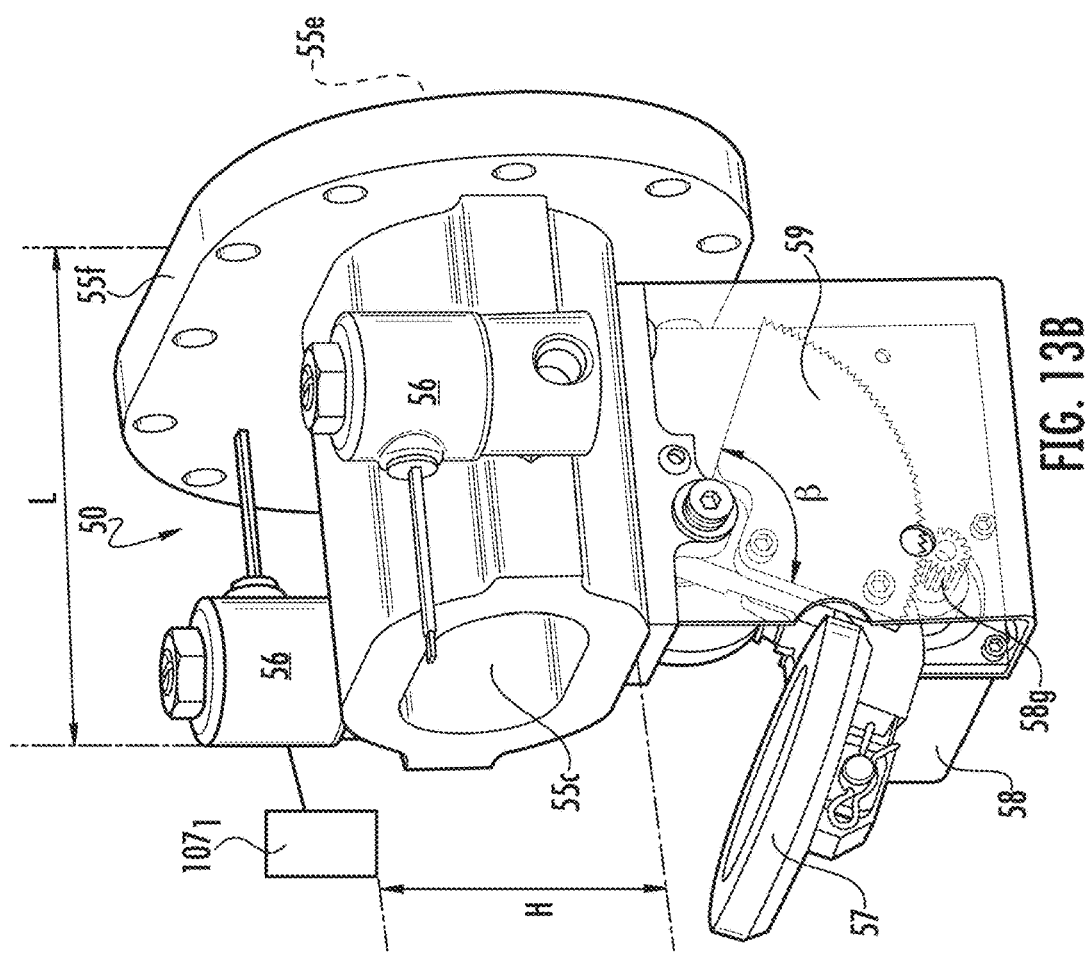
FIG. 13B is a side perspective view of the load lock chamber assembly shown in FIG. 13A.

Referring to FIGS. 13A-13C, the load lock assembly 50 is further described. As shown, the load lock assembly 50 includes a printed circuit board 112 with at least part of the control circuit 110 for the assembly 50. The load lock assembly 50 includes the stepper motor 58 with the shaft 58*s* that merges into the first gear 58*g*. This gear 58*g* rotates a second gear 59 attached to the door 57. The stepper motor 58 can be a frame size NEMA 11 compact stepper motor (body length 2.01 inches with a holding torque of 0.12 N-m and a speed of between 10-22 rotations per second), optionally with a step angle of 1.8 degrees. The stepper motor 58 can be a 211-20-02 compact stepper motor available from Lin Engineering, LLC, Morgan Hill, Calif.

The gears 58*g* to 59 can have a 10-1 reduction. The door 57 can couple to a compliant flat blade spring or other compliant member (not shown) to facilitate that the door mates to the housing 55*h* of the load lock chamber 55 with sufficient force to seal. As shown, a first valve 56 is a vacuum valve 56*v* that is in fluid communication with a turbo pump (156, FIG. 13B). The second valve 56 is an atmospheric vent valve 56*a* that can connect to a filter (not shown). In some embodiments, the valve bodies 56*b* (FIG. 13A, for example) can reside entirely external to the chamber housing 55*h* to avoid machining of the housing to accommodate ½ valve bodies). The valve bodies 56*b* may also be cylindrical.

As shown in FIGS. 13A-13C, the second gear 59 can reside above the first gear 58*g* and can have a semi-circular perimeter with an angular extent β of between 45-180 degrees. In some embodiments, the second gear 59 has only three sides, two of which are perpendicular and with one of the three sides having gear teeth 59*t* on an outer perimeter thereof with an angular extent of between 60-120 degrees, more typically about 90 degrees, that can rotate between first and second positions to open and close the door. As shown, the angular extent β is about 90 degrees between first and second positions to open and close the door 57 with an appropriate force to form a sufficient seal. The door 57 can have an arm 157 that is affixed to an upper surface of the second gear 59 via one or more fixation members 157*f* (when in a closed position).

Figure 14:
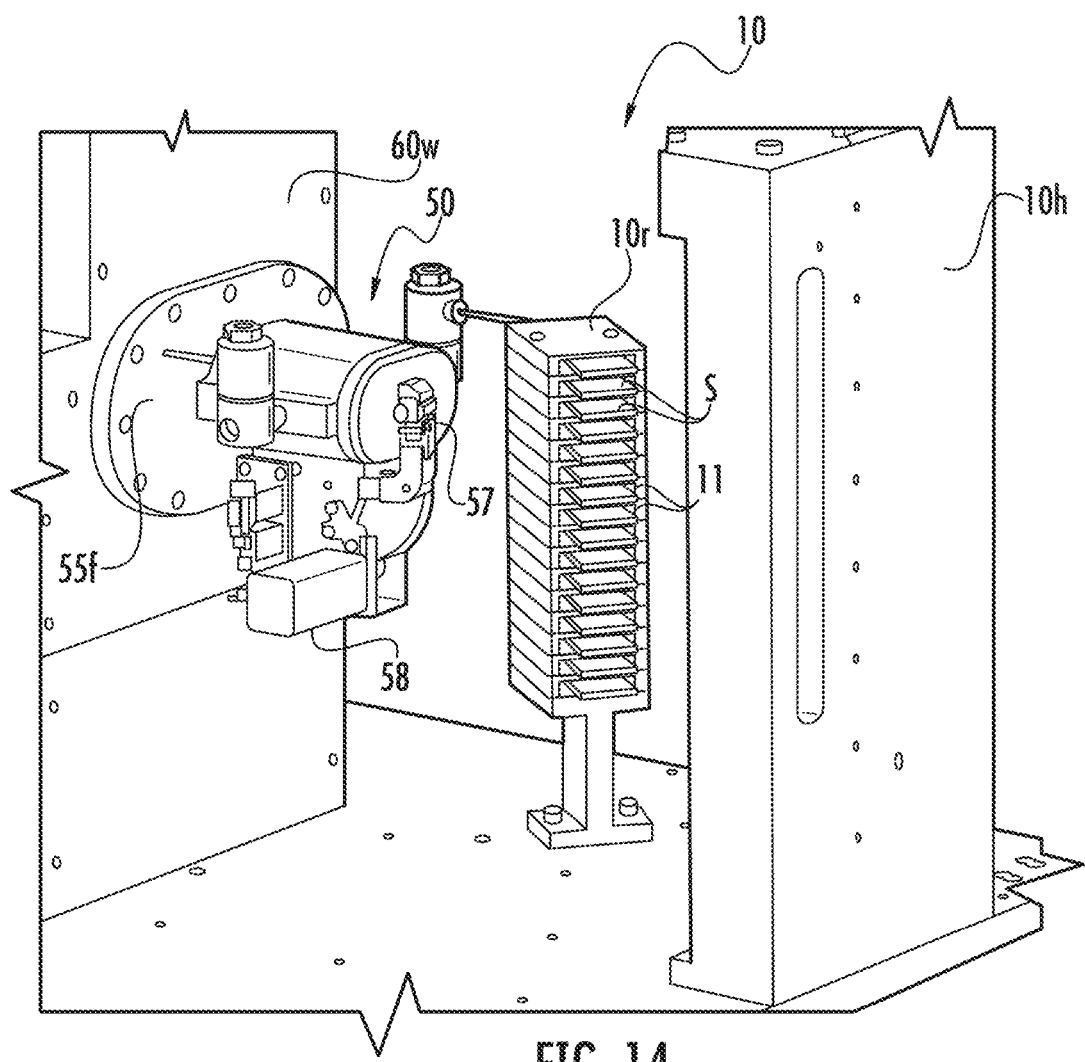
FIG. 14 is a side perspective view of the load lock chamber assembly adjacent an instrument internal storage rack of slides in the mass spectrometer according to embodiments of the present invention.

FIG. 14 illustrates that the mass spectrometer system 10 can include an internal storage rack 10*r* that is inside the housing 10*h* (optionally adjacent the door 57) for holding slides S before and/or after analysis. The storage rack 10*r* can provide a vertical column of compartments 11 for holding respective slides S. However, the storage rack 10*r* can be provided in any suitable configuration and is not required to have a vertical column of compartments. In some embodiments, the rack(s) 10*r* can have 16 slide storage compartments. In some embodiments, the unit 10 can have compact width, length and height dimensions of 0.7 m×0.7 m by 1.1 m and the internal space adjacent the load lock chamber 55 and/or vacuum chamber 60 for one or more storage racks for slides S can be in a foot print of about 0.25 m×0.3 m×0.3 meters.

Figure 15:
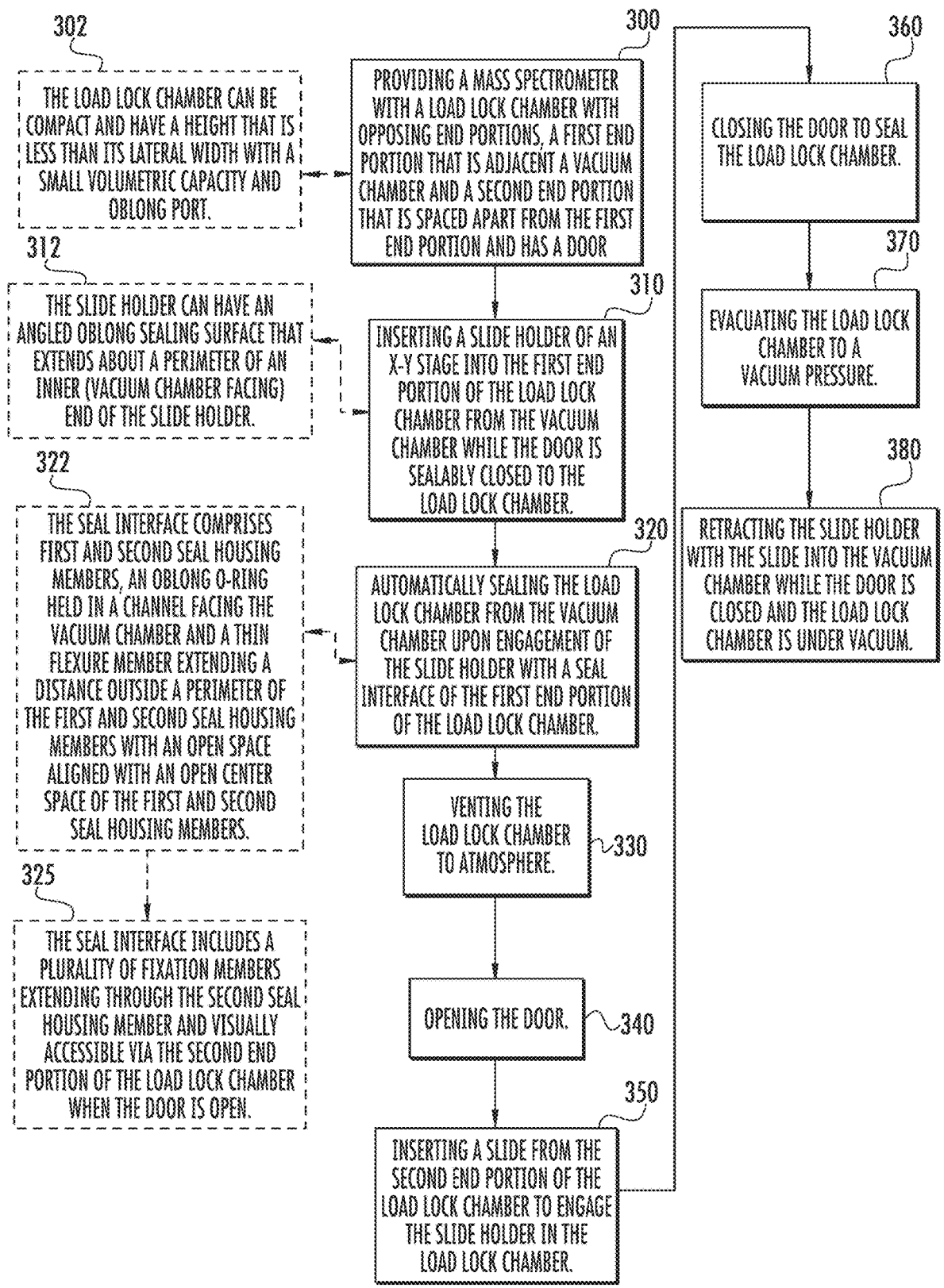
FIG. 15 is a flow chart of a method of handling a sample for analysis according to embodiments of the present invention.

FIG. 15 is a flow chart of exemplary actions for handling samples for analysis in a mass spectrometer. As shown, a mass spectrometer with a load lock chamber with opposing end portions is provided, a first end portion that is adjacent a vacuum chamber, and a second end portion that is spaced apart from the first end portion and has a door (block 300).

A slide holder of an X-Y stage is inserted into the first end of the load lock chamber from the vacuum chamber while the door is sealably closed to the load lock chamber (block 310). The load lock chamber is automatically sealed from the vacuum chamber upon engagement of the slide holder with a seal interface of the first end portion of the load lock chamber (block 320) The load lock chamber is then vented to atmosphere (block 330). The door is opened (block 340). A slide is inserted from the second end portion of the load lock chamber to engage the slide holder in the load lock chamber (block 350). The door is closed to seal the load lock chamber (block 360). The load lock chamber is evacuated to a vacuum pressure (block 370). The slide holder with the slide is retracted into the vacuum chamber while the door is closed and the load lock chamber is under vacuum (block 380). The sample is then analyzed in the vacuum chamber by the mass spectrometer.

The load lock chamber can be compact and have a height that is less than its lateral width with a small volumetric capacity that can be between about 1 cc to about 200 cc (empty), more typically between about 1 cc to about 100 cc, such as about 10 cc, about 15 cc, about 20 cc, about 25 cc, about 30 cc, about 35 cc, about 40 cc, about 45 cc, about 50 cc, about 55 cc, about 60 cc, about 65 cc, about 70 cc, about 75 cc, about 80 cc, about 85 cc, about 90 cc, about 95 cc and about 100 cc and the through channel can have an oblong perimeter shape (in a lateral dimension) (block 302).

The slide holder can have an angled oblong sealing surface that extends about a perimeter of an inner (vacuum chamber facing) end of the slide holder (block 312).

The seal interface can have first and second rigid seal housing members, an oblong O-ring held in a channel facing the vacuum chamber and a thin flexure member extending between and with a shape that extends a distance outside a perimeter of the first and second seal housing members with an open space aligned with an open center space of the first and second seal housing members (block 322).

The seal interface can include a plurality of fixation members extending through the seal housing member and visually accessible via the second end portion of the load lock chamber when the door is open (block 325).

The method can also include before operating the instrument in a sample analysis mode, during set-up or installation, inserting the slide holder into the load lock chamber, then in response thereto, moving a seal assembly cartridge in an up and down or side to side direction to self-center the seal assembly cartridge to align with the seal interface of the slide holder, then securing the seal assembly cartridge to a fixed position on the housing of the load lock chamber to provide an operative aligned position.

The mass spectrometry system 10 can be a MALDI-TOF MS system. MALDI-TOFMS systems are well known. See, e.g., U.S. Pat. Nos. 5,625,184; 5,627,369; 5,760,393; 6,002,127; 6,057,543; 6,281,493; 6,541,765; 5,969,348; and 9,536,726, the contents of which are hereby incorporated by reference as if recited in full herein. The majority of modern MALDI-TOF MS systems employ delayed extraction (e.g., time-lag focusing) to mitigate the negative spectral qualities of ion initial energy distribution.

In some embodiments, a sample (on a matrix slide) for analysis is introduced into a mass spectrometer system (optionally a MALDI-TOF MS system with a TOF flight tube in a vacuum chamber and comprising a laser). Laser pulses can be successively applied during analysis of a respective single sample to obtain mass spectra. A substance (e.g., constituent, biomolecule, microorganism, protein) in the sample is identified based on the obtained spectra. The TOF flight tube length can optionally be between about 0.4 m and about 1.0 m. However, longer or shorter flight tubes may be used in some embodiments.

The MS system 10 can optionally be a table top unit with TOF flight tube length about 0.8 m.

The sample can comprise a biosample from a patient and the identifying step can be carried out to identify if there is a defined protein or microorganism such as bacteria in the sample for medical evaluation of the patient.

The analysis can identify whether any of about 150 (or more) different defined species of bacteria and/or fungi is in a respective sample based on the obtained spectra. The target mass range can be between about 2,000-20,000 Daltons.

The mass spectrometer system 10 can include a patient record database and/or server that can include electronic medical records (EMR) with privacy access restrictions that are in compliance with HIPPA rules due to the client-server operation and privilege defined access for different users.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

That which is claimed:

1. A method handling a sample for analysis, comprising:
   providing a mass spectrometer with a load lock chamber with opposing first and second end portions, the first end portion being in or adjacent an acquisition vacuum chamber and the second end portion is spaced apart from the first end portion and has a door;
   inserting a slide holder of an X-Y stage into the load lock chamber from the acquisition vacuum chamber while the door is sealably closed to the second end portion of the load lock chamber;
   automatically sealing the first end portion of the load lock chamber from the acquisition vacuum chamber upon engagement of a seal interface of the slide holder with a seal interface of the first end portion of the load lock chamber;
   venting the load lock chamber to atmosphere;
   opening the door;
   inserting a slide from the second end portion of the load lock chamber to engage the slide holder in the load lock chamber;
   closing the door to seal the load lock chamber;
   evacuating the load lock chamber to a vacuum pressure; and
   retracting the slide holder with the slide into the acquisition vacuum chamber while the door is closed and the load lock chamber is under vacuum, wherein the method further comprises
   during set-up or installation:
   inserting the slide holder of the X-Y stage into the load lock chamber from the acquisition vacuum chamber;
   moving a seal assembly cartridge from a nominal position side to side and/or up or down to a self-centered second position to align with the seal interface of the slide holder in response to the inserting; and then
   securing the seal assembly cartridge to a fixed position on a housing of the load lock chamber to provide an operative aligned position with the X-Y stage.

2. The method of claim 1, further comprising analyzing a sample in or on the slide, wherein the sample is analyzed to identify one or more microorganisms in a mass range between about 2000 to about 20,000 Dalton.

3. The method of claim 1, wherein the second end portion of the load lock chamber is oblong in a lateral dimension with laterally opposing arcuate ends.

4. The method of claim 1, wherein the load lock chamber has a lateral width that is greater than a height and a volume that is in a range of about 1 cc and about 100 cc.

5. The method of claim 1, further comprising at least one valve in communication with the load lock chamber, wherein the venting is carried out by opening the at least one valve to atmosphere and the evacuating is carried out, in part, by closing the at least one valve.

6. The method of claim 1, wherein the closing is carried out by pivoting the door to shut and seal against the second end portion of the load lock chamber.

7. A method handling a sample for analysis, comprising:
   providing a mass spectrometer with a load lock chamber with opposing first and second end portions, the first end portion being in or adjacent an acquisition vacuum chamber and the second end portion is spaced apart from the first end portion and has a door;
   inserting a slide holder of an X-Y stage into the load lock chamber from the acquisition vacuum chamber while the door is sealably closed to the second end portion of the load lock chamber;
   automatically sealing the first end portion of the load lock chamber from the acquisition vacuum chamber upon engagement of a seal interface of the slide holder with a seal interface of the first end portion of the load lock chamber;
   venting the load lock chamber to atmosphere;
   opening the door;
   inserting a slide from the second end portion of the load lock chamber to engage the slide holder in the load lock chamber;
   closing the door to seal the load lock chamber;
   evacuating the load lock chamber to a vacuum pressure;
   retracting the slide holder with the slide into the acquisition vacuum chamber while the door is closed and the load lock chamber is under vacuum; and
   flexing a flexure member on the first end portion of the load lock chamber in response to the venting and/or the evacuating, wherein the flexure member comprises an outer perimeter that extends above and below a rigid seal housing member on the first end portion of the load lock chamber, and wherein the flexure member comprises an aperture that is aligned with the load lock chamber.

8. The method of claim 7, wherein the flexure member comprises a thin sheet, and wherein the outer perimeter of the flexure member comprises a plurality of spaced apart apertures that align with apertures in a flange of the housing of the load lock chamber.

9. The method of claim 7, wherein the rigid seal housing member comprises an outer facing surface with a channel that extends about port, and wherein the rigid seal housing member holds an O-ring in the channel so that the O-ring projects a distance outside the channel.

10. The method of claim 9, wherein the channel of the outer facing surface and the O-ring extend about an entire perimeter of the first end portion of the load lock chamber and both the channel and the first end portion of the load lock chamber are oblong in a lateral dimension with opposing laterally spaced apart arcuate sides.

11. A method handling a sample for analysis, comprising:
providing a mass spectrometer with a load lock chamber with opposing first and second end portions, the first end portion being in or adjacent an acquisition vacuum chamber and the second end portion is spaced apart from the first end portion and has a door;
inserting a slide holder of an X-Y stage into the load lock chamber from the acquisition vacuum chamber while the door is sealably closed to the second end portion of the load lock chamber;
automatically sealing the first end portion of the load lock chamber from the acquisition vacuum chamber upon engagement of a seal interface of the slide holder with a seal interface of the first end portion of the load lock chamber;
venting the load lock chamber to atmosphere;
opening the door;
inserting a slide from the second end portion of the load lock chamber to engage the slide holder in the load lock chamber;
closing the door to seal the load lock chamber;
evacuating the load lock chamber to a vacuum pressure; and
retracting the slide holder with the slide into the acquisition vacuum chamber while the door is closed and the load lock chamber is under vacuum,
wherein the closing is carried out by pivoting the door to shut and seal against the second end portion of the load lock chamber, wherein the door is coupled to a motor with a shaft and the shaft is coupled to a first gear that engages a second gear that is coupled to the door whereby the door is decoupled and spaced apart from the second end portion of the load lock chamber with the door in an open position.

12. The method of claim 11, wherein the second gear has only three sides with one of the three sides having an outer perimeter with gear teeth that engage the first gear and that has an angular extent in a range of about 60-120 degrees.

13. A method handling a sample for analysis, comprising:
providing a mass spectrometer with a seal assembly cartridge and a load lock chamber with opposing first and second end portions, the first end portion being in or adjacent an acquisition vacuum chamber and the second end portion is spaced apart from the first end portion and has a door;
inserting a slide holder of an X-Y stage into the load lock chamber from the acquisition vacuum chamber while the door is sealably closed to the second end portion of the load lock chamber;
automatically sealing the first end portion of the load lock chamber from the acquisition vacuum chamber upon engagement of a seal interface of the slide holder with a seal interface of the first end portion of the load lock chamber;
venting the load lock chamber to atmosphere;
opening the door;
inserting a slide from the second end portion of the load lock chamber to engage the slide holder in the load lock chamber;
closing the door to seal the load lock chamber;
evacuating the load lock chamber to a vacuum pressure; and
retracting the slide holder with the slide into the acquisition vacuum chamber while the door is closed and the load lock chamber is under vacuum,
moving the seal assembly cartridge from a nominal position side to side and/or up or down to a self-centered second position to align with the seal interface of the slide holder in response to the inserting; and then
securing the seal assembly cartridge to a fixed position on a housing of the load lock chamber to provide an operative aligned position with the X-Y stage.

* * * * *

UNITED STATES PATENT AND TRADEMARK OFFICE
CERTIFICATE OF CORRECTION

| | |
|---|---|
| PATENT NO. | : 11,244,819 B2 |
| APPLICATION NO. | : 16/950992 |
| DATED | : February 8, 2022 |
| INVENTOR(S) | : Bullock et al. |

It is certified that error appears in the above-identified patent and that said Letters Patent is hereby corrected as shown below:

In the Specification

Column 11, Line 30: Please correct "1004" to read -- 100$_4$ --

Column 11, Line 31: Please correct "1006" to read -- 100$_6$ --

Signed and Sealed this
Tenth Day of May, 2022

Katherine Kelly Vidal
*Director of the United States Patent and Trademark Office*